(12) United States Patent
Yasuda

(10) Patent No.: US 8,456,892 B2
(45) Date of Patent: Jun. 4, 2013

(54) SEMICONDUCTOR INTEGRATED CIRCUIT

(75) Inventor: Shinichi Yasuda, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 137 days.

(21) Appl. No.: 13/223,930

(22) Filed: Sep. 1, 2011

(65) Prior Publication Data

US 2012/0075910 A1 Mar. 29, 2012

(30) Foreign Application Priority Data

Sep. 29, 2010 (JP) ................................. 2010-219779

(51) Int. Cl.
*G11C 11/00* (2006.01)
*G11C 7/02* (2006.01)

(52) U.S. Cl.
USPC .......................... 365/148; 365/163; 365/210.1

(58) Field of Classification Search
USPC ......................................................... 365/148
See application file for complete search history.

(56) References Cited

U.S. PATENT DOCUMENTS

| | | | |
|---|---|---|---|
| 7,274,587 B2 | 9/2007 | Yasuda | 365/148 |
| 7,345,907 B2* | 3/2008 | Scheuerlein | 365/148 |
| 7,511,532 B2 | 3/2009 | Derharcobian et al. | 326/41 |
| 2008/0170428 A1* | 7/2008 | Kinoshita | 365/148 |
| 2010/0182821 A1 | 7/2010 | Muraoka et al. | 365/148 |
| 2011/0205780 A1 | 8/2011 | Yasuda et al. | 365/148 |
| 2012/0230105 A1* | 9/2012 | Yasuda et al. | 365/185.05 |
| 2012/0243297 A1* | 9/2012 | Katayama et al. | 365/148 |

* cited by examiner

*Primary Examiner* — Son Mai
(74) *Attorney, Agent, or Firm* — Ohlandt, Greeley, Ruggiero and Perle, L.L.P.

(57) ABSTRACT

According to one embodiment, a semiconductor integrated circuit includes first and second resistance change type memory element and first and second switches. The first resistance change type memory element includes a first terminal connected to a first power supply and a second terminal connected to a first node. The second resistance change type memory element includes a third terminal connected to the first node and a fourth terminal connected to a second power supply. The first switch includes one end of a first current path connected to a first program power supply and the other end of the first current path connected to the first node. The second switch includes one end of a second current path connected to the first node and the other end of the second current path connected to a second program power supply.

19 Claims, 13 Drawing Sheets

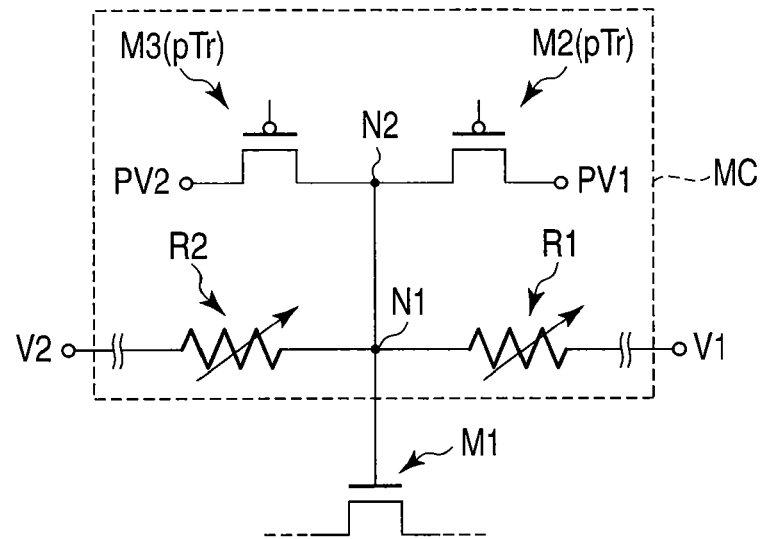
F I G. 3
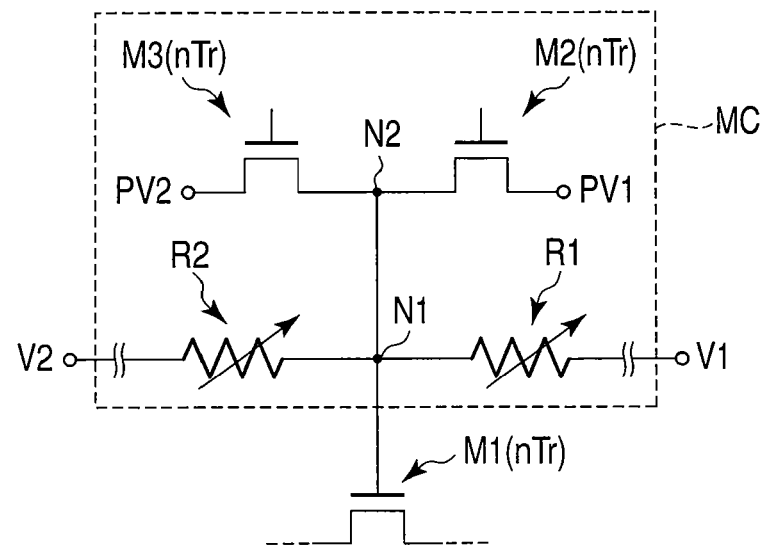
F I G. 4

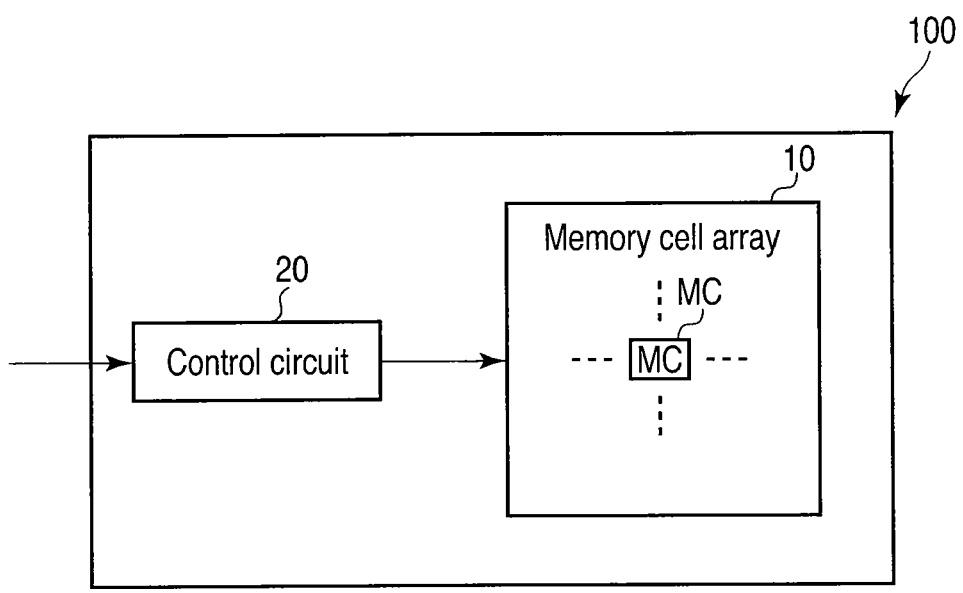
F I G. 5

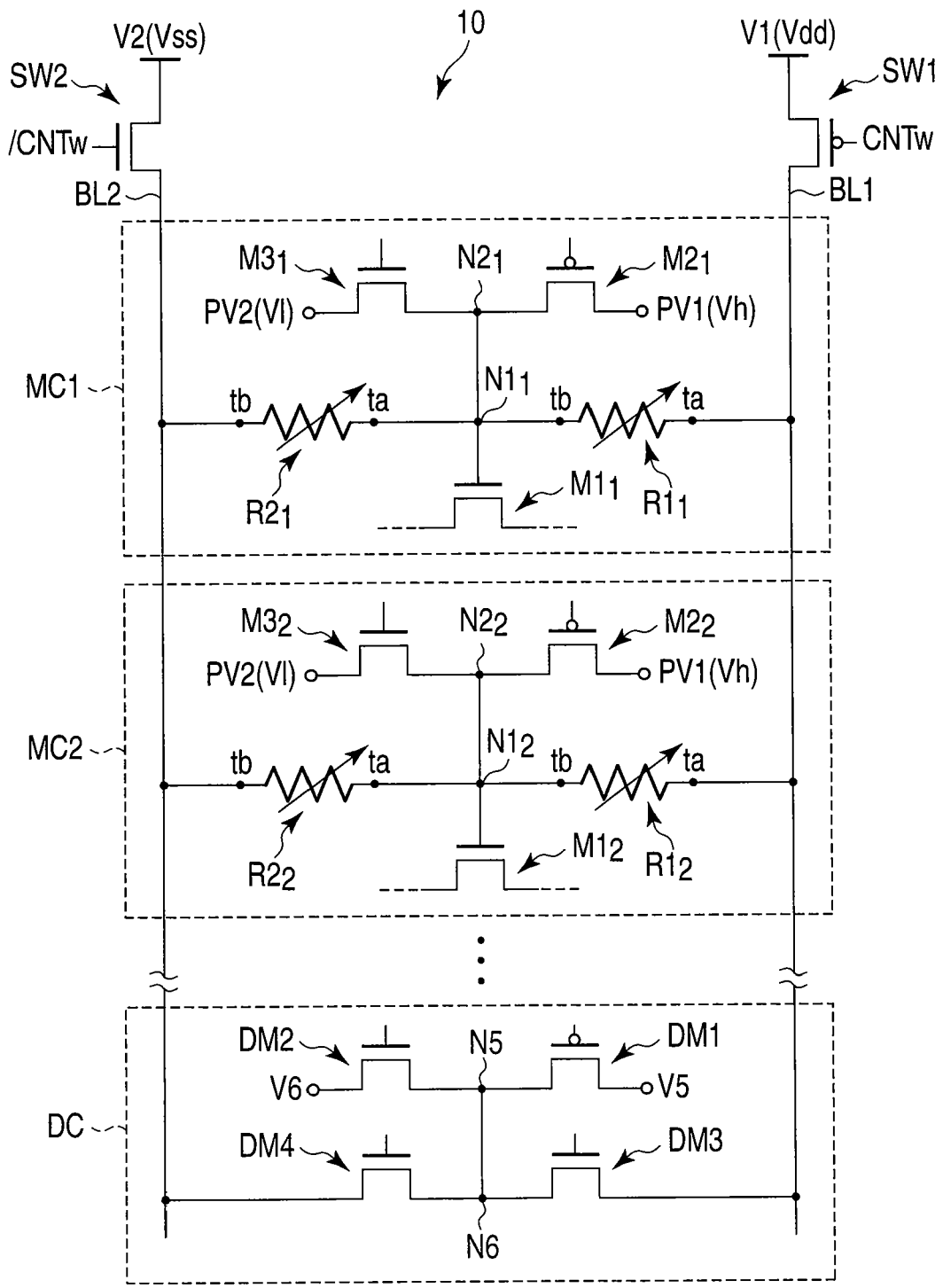
F I G. 6

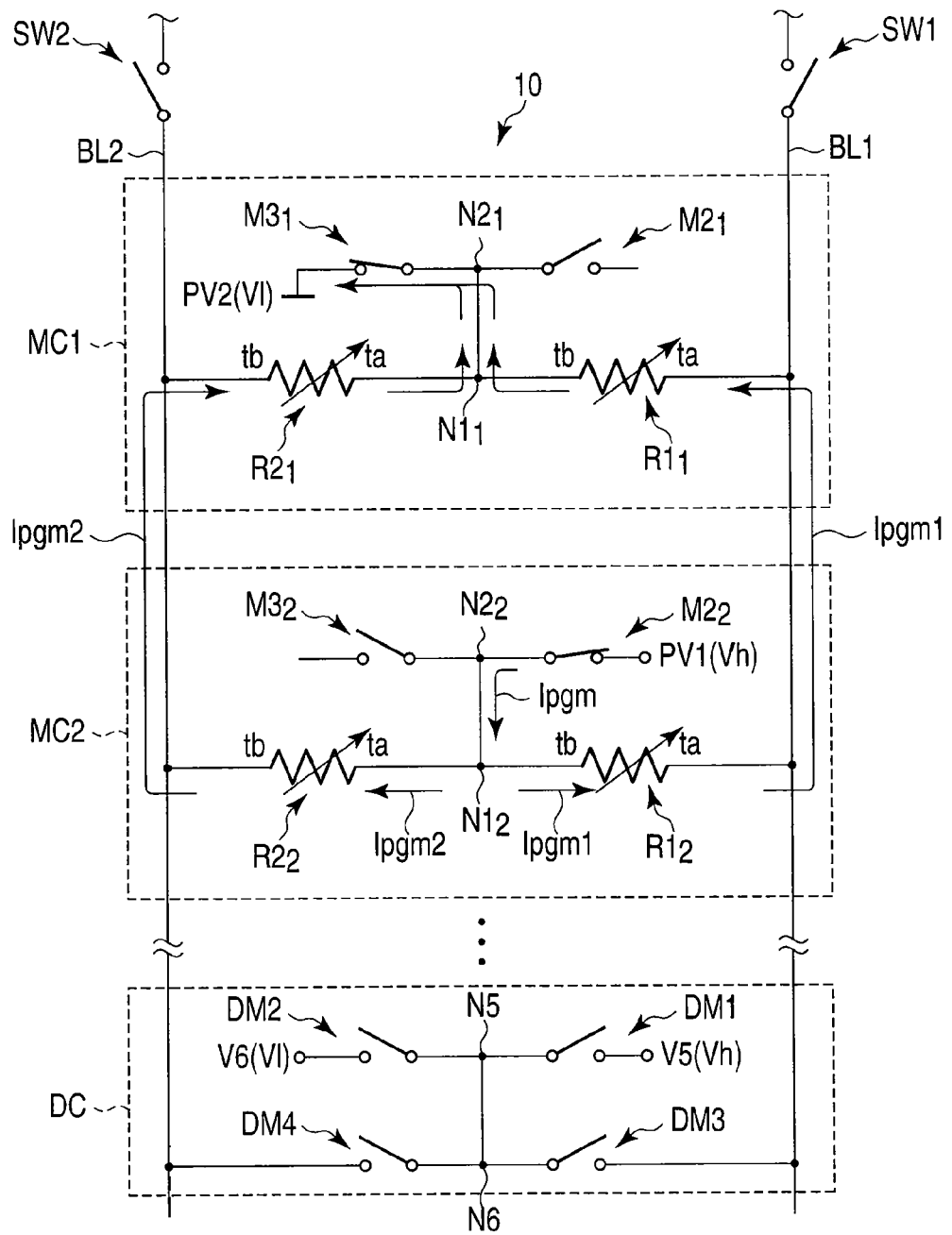
F I G. 9

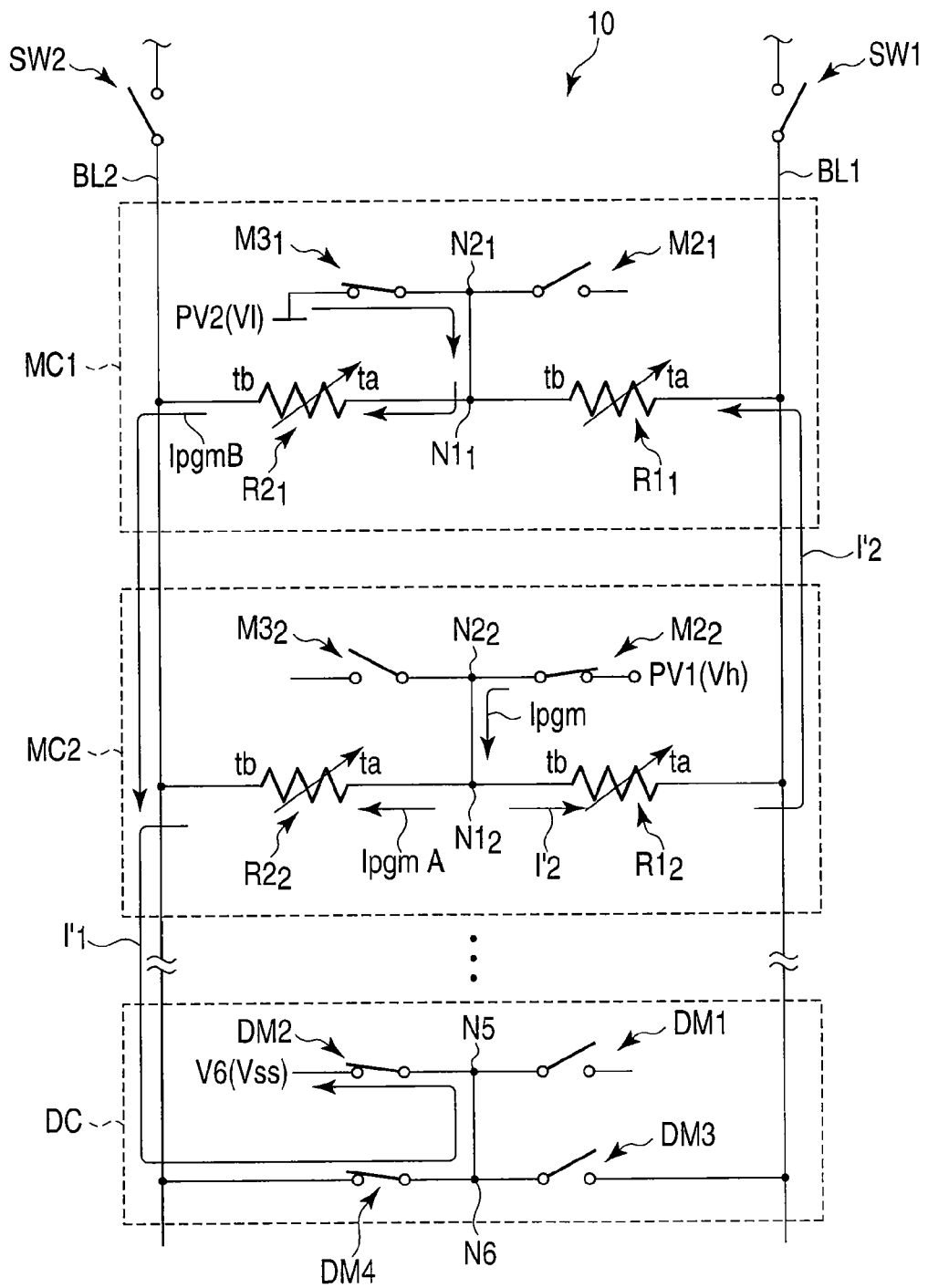
F I G. 10

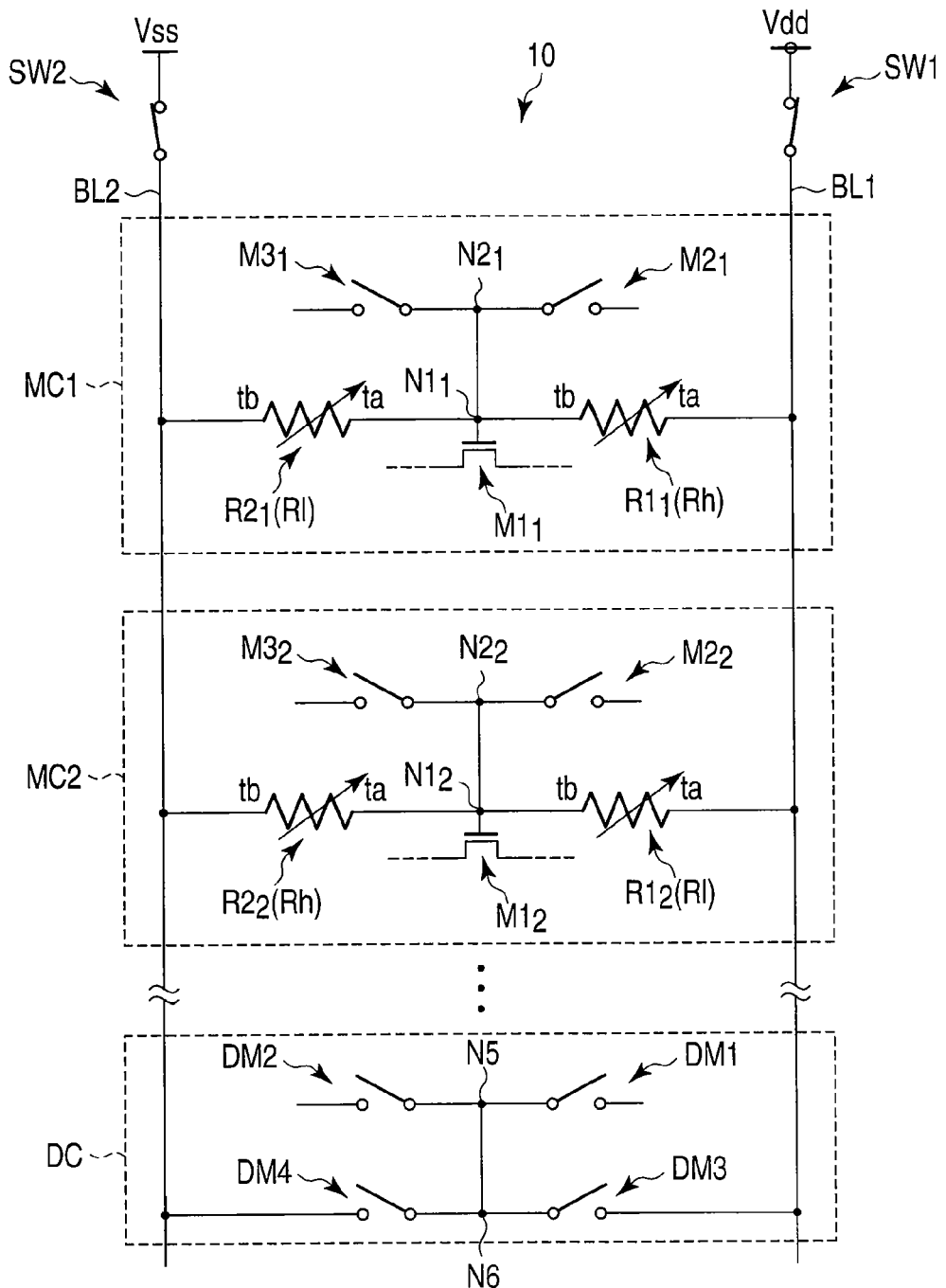
F I G. 12

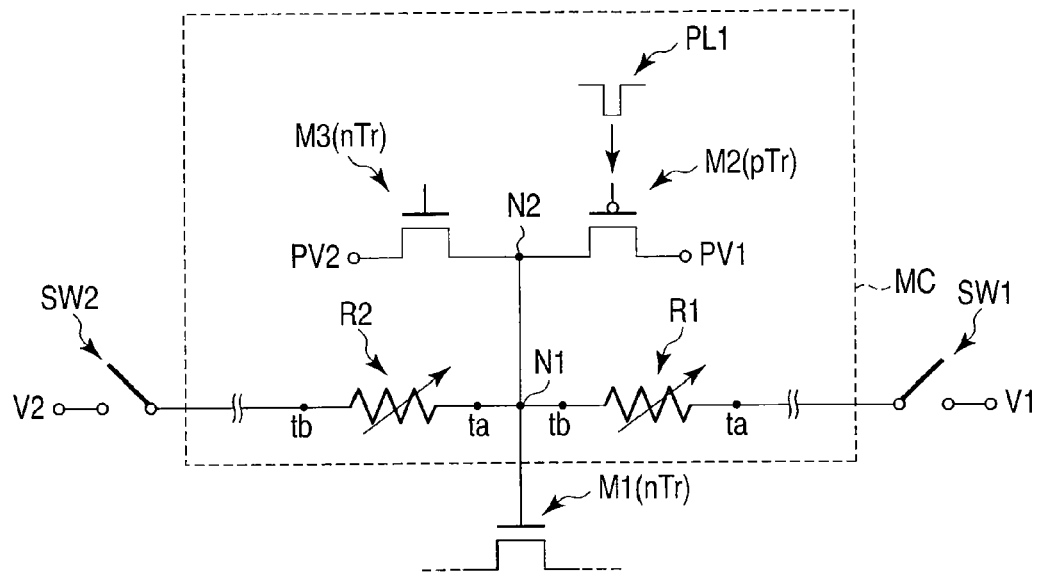
F I G. 1 3
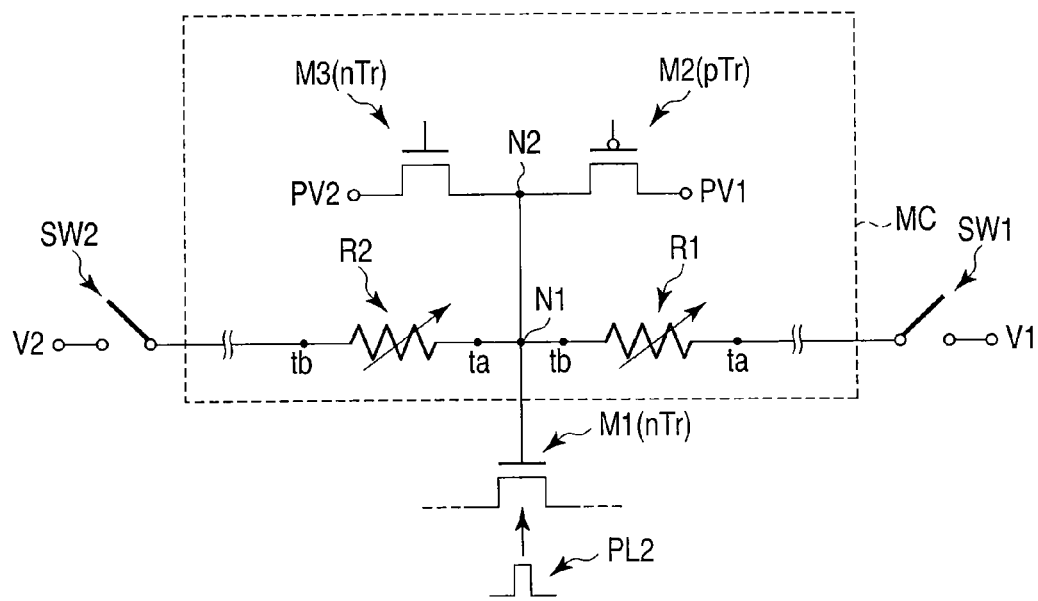
F I G. 1 4

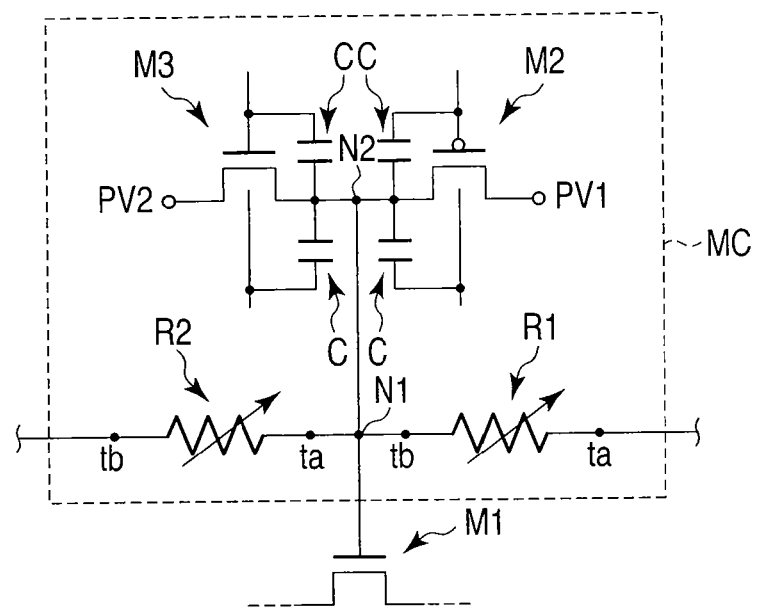
F I G. 1 5
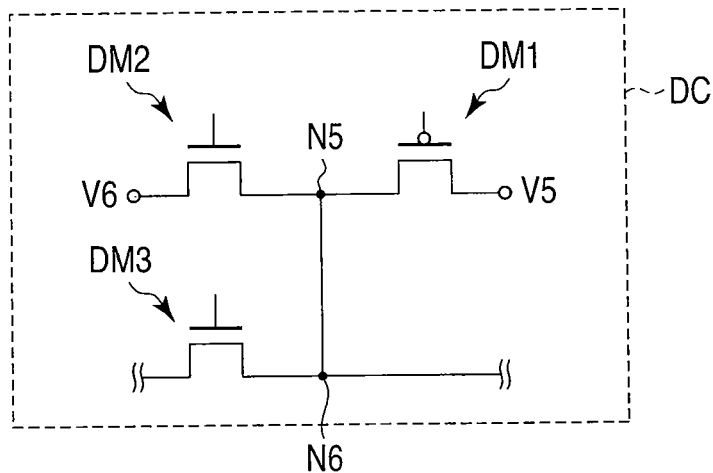
F I G. 1 6

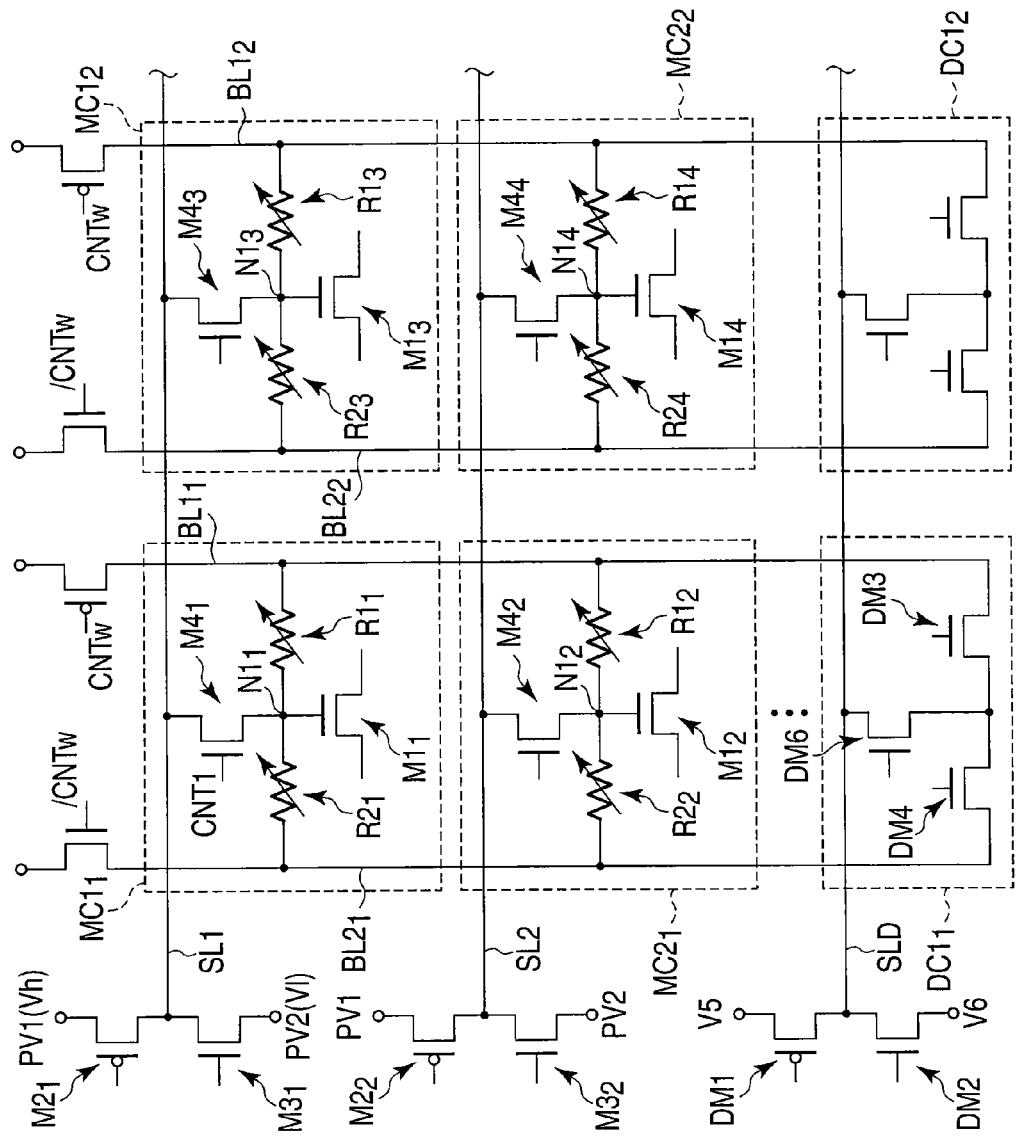
F I G. 17

US 8,456,892 B2

SEMICONDUCTOR INTEGRATED CIRCUIT

CROSS-REFERENCE TO RELATED APPLICATIONS

This application is based upon and claims the benefit of priority from prior Japanese Patent Application No. 2010-219779, filed Sep. 29, 2010, the entire contents of which are incorporated herein by reference.

FIELD

Embodiments described herein relate generally to a semiconductor integrated circuit.

BACKGROUND

Development of a resistance change type memory such as a ReRAM (Resistive RAM) or a PCRAM (Phase Change RAM) has accelerated.

The resistance change memory has been expected as a memory device that substitutes for an NAND flash memory as a file memory or a DRAM as a work memory.

In recent years, applying the resistance change type memory to a configuration memory of an FPGA (Field Programmable Gate Array) has been also attempted.

As a basic configuration, the FPGA includes a logic block (LB) that realizes arbitrary logic information, a connection block (CB) that performs input/output between the logic block and interconnects, and a switch block (SB) that switches connection of the interconnects. In each block, logic information or interconnect connection information are changed based on a value held in the configuration memory.

The switching of the interconnects in the switch block or the input/output in the connection block is controlled by using, e.g., a multiplexer. This control is executed by reading a selection signal, which is input to the multiplexer, from the configuration memory. The logic information in the logic block realizes a truth table by using a look-up table (LUT), and values associated with the truth table are written into the memory.

An SRAM (Static RAM) has been mainly used as the configuration memory of the FPGA. However, since the SRAM is a volatile memory, written data is lost when no power supply voltage is applied to a chip. The SRAM has a cell size larger than those of other memories, and its circuit area of the entire FPGA is large. Therefore, a nonvolatile memory having a small cell size is demanded as the configuration memory of the FPGA. Furthermore, in the FPGA, improvement in operation characteristics of the FPGA, e.g., a reduction in configuration time is also demanded.

BRIEF DESCRIPTION OF THE DRAWINGS

FIG. 3 and FIG. 4 are views for explaining modifications of the memory cell depicted in FIG. 1;

FIG. 5 is a block diagram showing a structural example of a semiconductor integrated circuit according to an embodiment;

FIG. 6 is an equivalent circuit diagram showing a memory cell array of the semiconductor integrated circuit according to an embodiment;

FIG. 9 is a view for explaining Operation Example 1 of the semiconductor integrated circuit according to an embodiment;

FIG. 10 is a view for explaining Operational Example 2 of the semiconductor integrated circuit according to an embodiment;

FIG. 12 is a view for explaining Operational Example 4 of the semiconductor integrated circuit according to an embodiment;

FIG. 13 and FIG. 14 are views for explaining Operational Example 5 of the semiconductor integrated circuit according to an embodiment;

FIG. 15 and FIG. 16 are views for explaining a modification of the semiconductor integrated circuit according to an embodiment;

FIG. 17 is a view for explaining an application of the semiconductor integrated circuit according to an embodiment.

DETAILED DESCRIPTION

Embodiment

Figure 1:
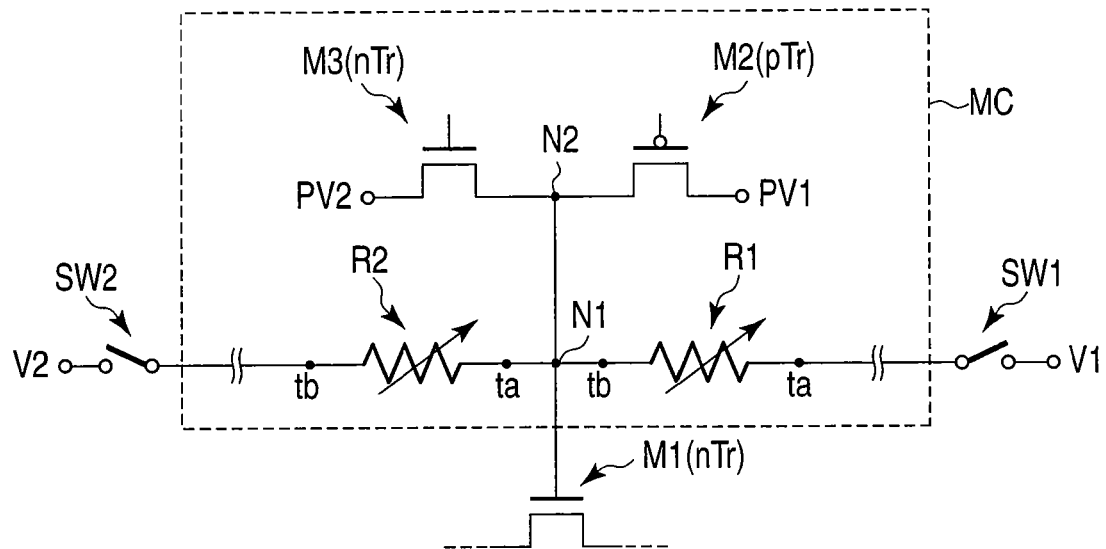
FIG. 1 is a view for explaining a memory cell in a semiconductor integrated circuit according to an embodiment.

This embodiment will now be described later in detail with reference to the accompanying drawings. In the following description, like reference numerals denote elements having like functions and structures to omit an overlapping explanation.

In general, according to one embodiment, a semiconductor integrated circuit includes first and second resistance change type memory element and first and second switches. The first resistance change type memory element includes a first terminal connected to a first power supply through a first power supply switch and a second terminal connected to a first node. The second resistance change type memory element includes a third terminal connected to the first node and a fourth terminal connected to a second power supply through a second power supply switch. The first switch includes a first control gate and a first current path, one end of the first current path is connected to a first program power supply, the other end of the first current path is connected to the first node. And the second switch includes a second control gate and a second current path, one end of the second current path is connected to the first node, the other end of the second current path is connected to a second program power supply configured to output a voltage value different from that of the first program power supply.

(1) Embodiment

Referring to FIG. 1 to FIG. 16, a semiconductor integrated circuit according to this embodiment relates to, e.g., a resistance change type memory and an FPGA (Field Programmable Gate Array) using the resistance change type memory.

(a) Memory Cell

The semiconductor integrated circuit according to this embodiment will now be described with reference to FIG. 1 to FIG. 4.

FIG. 1 shows an equivalent circuit diagram of a memory cell MC used in a resistance change type memory as the semiconductor integrated circuit according to this embodiment.

In this embodiment, the memory cell MC includes two resistance change type memory elements, R1 and R2 and two switches, M2 and M3.

One end (a first terminal) ta of the first resistance change type memory element R1 is connected to a power supply V1 through an interconnect (wiring line) and a switch (a power supply switch) SW1. The other end (a second terminal) tb of the first resistance change type memory element R1 is connected to one terminal ta of a second resistance change type memory element R2. The other end tb of the second resistance change type memory R2 is connected to a power supply V2 (or a bit line) through an interconnect and a switch (a power supply switch) SW2. The terminals ta and tb of the two connected resistance change type memory elements R1 and R2 form a connection node N1. The terminals ta and tb of each memory element forming the connection node N1 are terminals (electrodes) that have different polarities depending on a change in resistance state when changing the resistance state of each element, for example.

The resistance change type memory elements R1 and R2 hold resistance states (data) different from each other.

Figure 2:
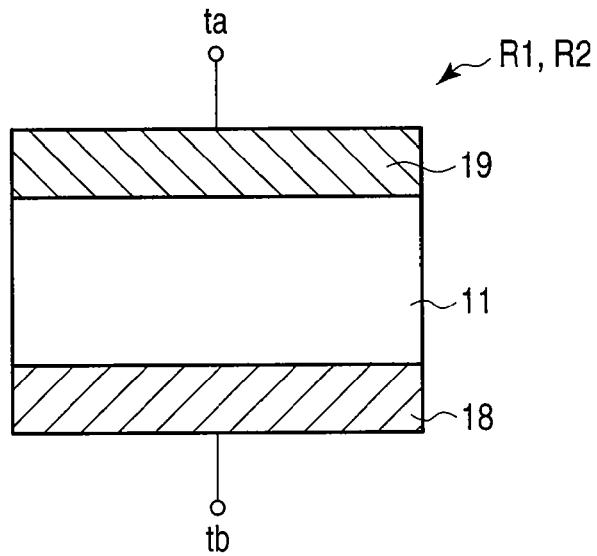
FIG. 2 is a view for explaining a resistance change type memory element.

FIG. 2 shows a basic configuration of the resistance change type memory element R1 or R2. The resistance change type memory element R1 or R2 is, e.g., a variable resistance element.

As shown in FIG. 2, the resistance change type memory element R1 or R2 includes two electrodes 18 and 19 and a resistance change film 11 is sandwiched between the electrodes 18 and 19.

The resistance change film 11 has properties (characteristics) that its resistance value varies when a voltage or a current is supplied thereto. For example, the resistance change film 11 has a transition metal oxide film or a perovskite metal oxide.

For example, there are $NiO_x$, $TiO_x$, $Cu_xO$, and others (e.g., $1 \leq x \leq 2$) as transition metal oxides, and there are PCMO ($Pr_{0.7}Ca_{0.3}M2$), Nb-added $SrTi(Zr)O_3$, Cr-added $SrTi(Zr)O_3$, and others as perovskite metal oxides.

For example, the properties that a resistance value of the resistance change film 11 varies are developed or stably obtained by a combination of the resistance change film 11 and the electrodes 18 and 19. Therefore, it is preferable to appropriately select a material of the electrodes 18 and 19 in accordance with a material of the resistance change film 11.

The electrodes 18 and 19 are used as terminals of the resistance change type memory elements R1 and R2. Here, the electrode 18 is determined as the terminal (a terminal having a second polarity) tb and the electrode 19 is determined as the terminal (a terminal having a first polarity) ta.

A resistance state of the resistance change type memory element R1 or R2 changes depending on an operation mode called a bipolar type or an operation mode called a unipolar type.

A resistance state of the resistance change type memory element which is of the bipolar type changes depending on a polarity of a voltage applied to the terminals (the voltage will be referred to as a program voltage). A resistance state of the resistance change type memory element which is of the unipolar type changes depending on an intensity of the program voltage applied to the terminals.

For example, a resistance value of the resistance change type memory element which is of the bipolar type changes by movement of ions (a change in a concentration profile) in the resistance change film 11. For example, a resistance value of the resistance change type memory element which is of the unipolar type changes by generation or disappearance (partial disappearance) of a fine current path (a filament) in the resistance change film 11.

Which one of the unipolar type and the bipolar type the resistance change type memory element comes in is mainly dependent on a material of the resistance change film 11 and/or the electrodes 18 and 19.

Irrespective of the bipolar type and the unipolar type, a resistance state of the resistance change type memory element (a variable resistance element) is reversibly changed from a high-resistance state to a low-resistance state or from a low-resistance state to a high-resistance state by application of a predetermined program voltage (or a current) between the terminals. Further, the resistance state that the resistance change type memory element has been changed to is substantially nonvolatile until the predetermined program voltage is applied.

When each of the resistance change type memory elements R1 and R2 is the resistance change type memory element which is of the bipolar type, polarities of voltages applied to the electrodes 18 and 19 (the terminals ta and tb) are opposite depending on a situation where the resistance state of the element is a low-resistance state (a program state, writing data "0") and a situation where the resistance state of the element is a high-resistance state (an erase state, writing data "1").

In the resistance change type memory element which is of the bipolar type, when the terminal tb is set to a high-potential side and the terminal ta of the memory element is set to a low-potential side, a bias (a first program voltage) is applied in a direction extending from the terminal tb toward the terminal ta. In this case, for example, the resistance state of each of the resistance change type memory elements R1 and R2 changes from the high-resistance state to the low-resistance state. On the other hand, when the terminal ta of the resistance change type memory element is set to the high-potential side and the terminal tb of the element is set to the low-potential side, a bias (a second program voltage) is applied in a direction extending from the terminal ta toward the terminal tb. In this case, as a reverse pattern of the situation where the terminal tb is set to the high-potential side, the resistance state of each of the resistance-change type memory elements R1 and R2 changes from the low-resistance state to the high-resistance state.

As described above, in the resistance change type memory element (the variable resistance element) which is of the bipolar type, since the polarity of the voltage (a current of an electric field) is reversed depending on a resistance state to which the element is changed, a polarity of the terminal of the resistance change type memory element is also defined.

It is to be noted that even the resistance change type memory element which is of the bipolar type of course has a threshold value (a voltage value or a current value) required to change its resistance state.

When each of the resistance change type memory elements R1 and R2 is the unipolar type memory element, an intensity of a voltage (a voltage value) applied to the electrodes 18 and 19 (the terminals ta and tb), a pulse width of the voltage, or both the voltage value and the pulse width differ depending on a situation where a resistance state of the element is set to the low-resistance state (the program state, writing data "0") and a situation where the same is set to the high-resistance state (the erase state, writing data "1"). In the unipolar resistance change type memory element, voltages applied to the terminals ta and tb have the same polarity. That is, at the time of writing data (when the resistance state changes), one of the terminals (the electrodes) of the resistance change type memory element is set as a cathode, and the other of the same is set as an anode.

In the resistance change type memory element (the variable resistance element), an operation of changing the resistance state of the resistance change type memory element to a low state from a high state is called a set operation. An operation of changing the resistance state of the resistance change type memory element to a high state from a low state is called a reset operation.

In the bipolar resistance change type memory element, an electrode set to a high-potential side in the set operation (the terminal tb in this example) may be referred to as a set electrode or set terminal and an electrode set to a high potential in the reset operation (the terminal ta in this example) may be referred to as a reset electrode or reset terminal hereinafter.

When the bipolar resistance change type memory elements are used in the memory cell MC, the terminals (polarities of the elements) of the resistance change type memory elements R1 and R2 are arranged in such a manner that the same polarities are aligned from the power supply V1 side toward the power supply V2 side. That is, in the two resistance change type memory elements R1 and R2 in one memory cell MC, the terminals (the terminals having a first polarity) ta and the terminals (the terminals having a second polarity) tb are alternately aligned from the power supply V1 side toward the power supply V2 side. In the example shown in FIG. 1, the terminals ta and tb of the resistance change type memory elements are arranged in an order of "ta-tb-ta-tb" from the power supply V1 toward the power supply V2. Conversely, the terminals may be aligned between V1 and V2 in an order of "tb-ta-tb-ta" from the power supply V1 toward the power supply V2.

Furthermore, in this embodiment, the operations of changing the resistance state of each of the resistance change type memory elements R1 and R2, i.e., the set operation and the reset operation are also called data writing.

The two switches M2 and M3 are, e.g., field effect transistors (FETs). The switches M2 and M3 will be referred to as transistors M2 and M3.

One end of a current path of the transistor M2 is connected to a power supply PV1. The other end of the current path of the transistor M2 is connected to one end of a current path of the transistor M3. The two connected current paths of the transistors M2 and M3 form a connection node N2. The other end of the current path of the transistor M3 is connected to the power supply PV2. The current paths of the transistors M2 and M3 are connected to the connection node N1 through the connection node N2. The current paths of the transistors M2 and M3 are connected to the terminals of the resistance change type memory elements R1 and R2 via the connection node N1 and the connection node N2.

A control signal is input to a control node (a control gate) of each of the transistors M2 and M3. The control signal controls ON/OFF of the transistor when writing data into the resistance change type memory elements R1, R2. The transistors M2 and M3 connected to the power supplies PV1 and PV2 are also called select transistors.

In FIG. 1, of the two transistors M2 and M3 as the switches, for example, one transistor M2 is, e.g., a p-channel type MOS transistor M2, and the other transistor M3 is, e.g., an n-channel type MOS transistor M3.

Each of the power supply V1 and the power supply V2 outputs a voltage value that is utilized to operate the memory cell MC and a circuit using the memory cell. The power supply V1 applies a voltage value V1 to the terminal of the resistance change type memory element R1, and the power supply V2 applies a voltage value V2 to the terminal of the resistance change type memory element R2. The power supplies V1 and V2 will be referred to as drive power supplies V1 and V2 and the voltage values V1 and V2 output from these power supplies will be referred to as drive voltages V1 and V2 hereinafter.

Each of the power supplies PV1 and PV2 outputs a voltage value that is utilized when executing a program operation (writing/erasing data) of the memory cell MC (the resistance change type memory element R1 or R2). The power supply PV1 outputs a voltage value Vh, and the power supply PV2 outputs a voltage value Vl.

The power supplies PV1 and PV2 will be referred to as program power supplies PV1 and PV2 and voltage values Vh and Vl output from these power supplies will be referred to as program voltages Vh and Vl hereinafter.

When driving the memory cell MC, the drive power supplies V1 and V2 are connected to the memory cell MC by the switches SW1 and SW2, and the program power supplies PV1 and PV2 are electrically disconnected from the memory cell MC. At the time of programming (writing/erasing data) with respect to the memory cell MC, one of the program power supply PV1 and the power supply PV2 is connected to the memory cell MC in accordance with data to be written. At the time of programming, the drive power supplies V1 and V2 are electrically disconnected from the memory cell MC.

It is to be noted that resistance states of the resistance change type memory elements R1 and R2 must not change by the drive voltages V1 and V2.

In this embodiment, the memory cell MC is applied to, e.g., a resistance change type memory or an FPGA (Field Programmable Gate Array). For example, the memory cell MC depicted in FIG. 1 is used as a configuration memory of the FPGA.

When the memory cell MC is used as the configuration memory, it is connected to another circuit through a path switch M1. The path switch M1 is, e.g., an n-channel type MOS transistor. A current path of the path switch M1 is connected to a position between interconnects. In this embodiment, a transistor as the path switch M1 is also called a path transistor.

In FIG. 1, the memory cell MC and the path transistor M1 form a nonvolatile programmable logic switch.

The path transistor M1 switches connection statuses of interconnects connected to each of one end and the other end of the current path of the path transistor M1 based on data (interconnect information) stored in the memory cell MC.

A control node of the path transistor M1 (a gate of the transistor) is connected to the connection node N1 between the resistance change type memory elements R1 and R2. At the time of driving the FPGA using the memory cell MC according to this embodiment, the power supplies V1 and V2 are connected to the memory cell MC, and a potential Vx in the connection node N1 is applied to a gate of the path transistor M1.

If the applied potential Vx is not lower than a threshold value of the path transistor M1, the path transistor M1 is turned on, and the interconnects connected to each of the one end and the other end of the path transistor M1 become electrically conductive.

On the other hand, if the applied potential Vx is smaller than the threshold value of the path transistor M1, the path transistor M1 is turned off, and the interconnects connected to each of the one end and the other end of the path transistor M1 become non-conductive.

When the path transistor M1 has entered an electrically conductive state, a signal (which is called an FPGA signal) flows between the interconnects through the ON path transistor M1.

The potential Vx in the connection node N1 differs depending on combinations of the two resistance change type memory elements R1 and R2 and their resistance states. For example, the potential Vx in the connection node N1 when a resistance value of the resistance change type memory element R1 is lower than a resistance value of the resistance change type memory element R2 has a value close to the drive voltage V1, and the potential Vx in the connection node N1 when a resistance value of the resistance change type memory element R1 is higher than a resistance value of the resistance change type memory element R2 has a value close to the drive voltage V2.

It is to be noted that a p-channel type MOS transistor is used for the transistor M2 and n-channel type MOS transistors are used for the transistors M1 and M3 in the memory cell MC depicted in FIG. 1. In the memory cell MC, it is preferable to use the p-channel type MOS transistor for a transistor configured to apply the program voltage Vh on the high-potential side to the resistance change type memory element. It is preferable to use the n-channel type MOS transistor for a transistor configured to apply the program voltage Vl on the low-potential side to the resistance change type memory element.

However, the present embodiment is not restricted to this configuration and, for example, as shown in FIG. 3, the p-channel type MOS transistors may be used for the two transistors M2 and M3 in the memory cell MC, and the n-channel type MOS transistor may be used for the path transistor M1. As shown in FIG. 4, transistors may have the same conductivity type, e.g., the n-channel type MOS transistors may be used for the path transistor M1 and the transistors M2 and M3 in the memory cell. A transmission gate formed of the p-channel type MOS transistor and the n-channel type MOS transistor may substitute for the transistor as a switch. Moreover, MEM (Micro Electronic-Mechanical) switches may substitute for the transistors M2 and M3.

In the path transistor M1, the p-channel type MOS transistor may be used, or the transmission gate formed of the p-channel type MOS transistor and the n-channel type MOS transistor may be used.

In a case that the path transistor M1 is the p-channel type MOS transistor, if the potential Vx is smaller than a threshold voltage of the path transistor M1 (that is, the potential Vx is negative bias), the path transistor M1 is turned on, and the interconnects connected to the one end and the other end of the path transistor enter a conductive state. On the other hand, if the applied potential Vx is equal to or above the threshold voltage of the path transistor M1, the path transistor M1 is turned off, and the interconnects connected to the one end and the other end of the path transistor M1 enter a non-conductive state.

In a case that the path switch M1 is the transmission gate, when a voltage equal to or higher than the threshold voltage is applied to the n-channel type MOS transistor and a voltage smaller than the threshold voltage is applied to the p-channel type MOS transistor, the transmission gate is turned on, and the interconnects connected to the transmission gate enters the conductive state. On the other hand, when a voltage smaller than the threshold voltage is applied to the n-channel type MOS transistor and a voltage equal to or higher than the threshold voltage is applied to the p-channel type MOS transistor, the transmission gate is turned off, and the interconnects connected to the transmission gate enters the non-conductive state. In this case, an inverter is further provided or the memory cell MC is further added to generate a voltage obtained by reversing the potential Vx.

The memory cell MC according to this embodiment is formed of the two transistors and the two resistance change type memory elements (variable resistance elements) R1 and R2. Additionally, in the memory cell MC according to this embodiment, the resistance change type memory elements R1 and R2 are provided above the transistors M2 and M3 through an interlayer insulating film. Therefore, a cell size (an occupied area on a chip) of the memory cell MC according to this embodiment is smaller than that of an SRAM.

Further, the resistance change type memory elements R1 and R2 as the memory elements store data in a nonvolatile manner. Therefore, when the memory cell MC according to this embodiment is used in the FPGA, a nonvolatile configuration memory can be realized.

(b) Memory Cell Array

A memory cell array 10 using the memory cells depicted in FIG. 1 will now be described with reference to FIG. 5 and FIG. 6.

FIG. 5 is a schematic view showing a structural example of a semiconductor integrated circuit 100 according to this embodiment. As shown in FIG. 5, in the semiconductor integrated circuit 100 according to this embodiment, the memory cell array 10 includes a plurality of memory cells MC. Furthermore, operations of the memory cell array 10 and the memory cells MC are controlled by a control circuit 20. The control circuit 20 may be provided on the same chip as that of the memory cell array 10 or may be provided on a chip different from that of the memory cell array 10.

The control circuit 20 controls operations for the memory cells MC in the memory cell array 10 in response to a request from the outside. The control circuit 20 controls writing data into the memory cell MC. Moreover, as described above, when the memory cell array 10 is used as the configuration memory of the FPGA, the control circuit 20 controls an operation of the memory cell array 10 as the FPGA (which will be referred to as an FPGA operation hereinafter).

FIG. 6 is an equivalent circuit diagram for explaining a circuit configuration of the memory cell array 10 using each memory cell MC depicted in FIG. 1.

As shown in FIG. 6, the memory cell array 10 has a circuit configuration that the drive power supplies V1 and V2 are shared by the plurality of memory cells MC1 and MC2 and the memory cells MC are arrayed.

As shown in FIG. 6, the plurality of memory cells MC1, MC2, . . . are provided in the memory cell array 10. Although FIG. 6 shows only two memory cells MC1 and MC2, the memory cell array 10 may of course include three or more memory cells.

One end of each of the memory cells MC1 and MC2 is connected to a control line BL1, and the other end of each of the memory cells MC1 and MC2 is connected to a control line BL2.

More specifically, in memory cells MC1 and MC2, terminals to of resistance change type memory elements (variable resistance elements) $R1_1$ and $R1_2$ are connected to the control line BL1, and terminals tb of the resistance change type memory elements $R2_1$ and $R2_2$ are connected to the control line BL2. The control lines BL1 and BL2 will be referred to as bit lines BL1 and BL2 hereinafter.

In this manner, each memory cell MC1 or MC2 is connected to a position between the bit lines BL1 and BL2. The memory cells MC1 and MC2 are aligned along extending directions of the bit lines BL1 and BL2.

It is to be noted that an internal configuration of the memory cell is substantially the same as the configuration depicted in FIG. 1, and hence a detailed description will be given as required.

The first bit line BL1 is connected to the drive power supply V1 through a power supply switch SW1. The second bit line BL2 is connected to the drive power supply V2 through a power supply switch SW2. The power supply V1 is, e.g., a power supply on a high-potential side of the memory (the chip) and outputs a power supply voltage Vdd. The power supply V2 is, e.g., a power supply (a ground) on a low-potential side of the chip and outputs a ground voltage Vss.

The power supply switches SW1 and SW2 control connection statuses of the bit lines BL1 and BL2 and the drive power supplies V1 and V2. The power supply switches SW1 and SW2 are, e.g., field effect transistors SW1 and SW2. For example, a p-channel type MOS transistor SW1 is provided between the power supply V1 and the bit line BL1. One end of a current path of the p-channel type MOS transistor SW1 is connected to the power supply V1, and the other end of the current path of the p-channel type transistor SW1 is connected to the bit line BL1. For example, an n-channel type MOS transistor SW2 is provided between the power supply (the ground) V2 and the bit line BL2. One end of a current path of the n-channel type transistor SW2 is connected to the power supply V2, and the other end of the current path of the n-channel type transistor SW2 is connected to the bit line BL2.

Control signals CNTw and /CNTw from the control circuit 20 are input to control gates of the p-channel type and n-channel type transistors SW1 and SW2 as the power supply switches, respectively. The control signal CNTw that is input to the p-channel type transistor SW1 has a complementary relationship with respect to /CNTw that is input to the n-channel type transistor SW2. That is, when the control signal CNTw is indicative of an "1(H)" level, the control signal /CNTw as an inversion signal is indicative of a "0(L)" level. Contrarily, when the control signal CNTw is indicative of the "0" level, the control signal /CNTw is indicative of the "1" level.

As described above, one power supply switch SW1 is the p-channel type transistor, and the other power supply switch SW2 is the n-channel type transistor. Therefore, when the control signals CNTw and /CNTw for the respective power supply switches SW1 and SW2 have the complementary relationship, the power supply switches SW1 and SW2 can be substantially simultaneously turned on or off. Therefore, connection relationships between the plurality of memory cells MC1 and MC2 and the power supplies V1 and V2 can be relatively easily controlled.

Program power supplies PV1 and PV2 for the memory cells MC1 and MC2 output program voltages Vh and Vl. The program voltages Vh and Vl have intensities (potentials) sufficient to write data into the resistance change type memory elements $R1_1$, $R1_2$, $R2_1$, and $R2_2$, i.e., to change resistance states of the resistance change type memory elements. For example, the program voltage Vh is larger than the program voltage Vl.

For example, a potential difference |Vh−Vl| (an absolute value) required to change a resistance value of the resistance change type memory element is larger than a potential difference (Vdd−Vss). If this relationship is satisfied, the voltage Vh and the voltage Vdd may have the same intensity, or the voltage Vl and the voltage Vss may have the same intensity.

For example, besides the memory cells MC1 and MC2, a dummy cell DC is provided in the memory cell array 10. The dummy cell DC is connected between the first bit line BL1 and the second bit line BL2. The dummy cell DC is connected in parallel to the memory cells MC1 and MC2 between the two bit lines BL1 and BL2.

The dummy cell DC is formed of a switch alone without having a resistance change type memory element (a variable resistance element), for example. The dummy cell DC includes, e.g., four switches (field effect transistors) DM1, DM2, DM3, and DM4. An internal configuration of the dummy cell DC corresponds to a configuration that each resistance change type memory element in the memory cell is substituted by the transistor.

In the dummy cell DC, transistors DM3 and DM4 are connected to the bit lines BL1 and BL2 in place of the resistance change type memory elements. In the dummy cell DC, one end of a current path of the transistor DM3 is connected to the bit line BL1, the other end of the current path of the transistor DM3 is connected to one end of a current path of the transistor DM4, and the other end of the current path of the transistor DM4 is connected to the bit line BL2. The connected current paths of the two transistors DM3 and DM4 form a connection node N6.

Furthermore, in the dummy cell DC, one end of a current path of the transistor DM1 is connected to a power supply V5, the other end of the current path of the transistor DM1 is connected to one end of a current path of the transistor DM2, and the other end of the current path of the transistor DM2 is connected to a power supply V6. The connected current paths of the two transistors DM1 and DM2 form a connection node N5, and the connection node N5 is connected to the connection node N6. As a result, the one end of each of the current paths of the transistors DM1 and DM2 is connected to the connection node N6. The power supplies V5 and V6 connected to the transistors DM1 and DM2 output predetermined voltage values in accordance with a circuit configuration or a predetermined operation.

The transistors DM3 and DM4 in the dummy cell DC control connection statuses between the bit lines BL1 and BL2 and the dummy cell DC. Further, the transistors DM1 and DM2 in the dummy cell DC control connection statuses between the power supplies V5 and V6 and the bit lines BL1 and BL2.

The transistors DM1, DM2, DM3, and DM4 in the dummy cell DC may be n-channel type MOS transistors or p-channel type MOS transistors. Alternatively, transmission gates or MEM switches may be used in place of the transistors.

The number of memory cells connected to the bit lines BL1 and BL2 is not restricted. However, it is preferable to appropriately determine the number of memory cells in one memory cell array 10 while considering, e.g., a size of each transistor in the dummy cell DC, an electric power supply capacity of a main power supply, or the numbers of memory cells and resistance change type memory elements arranged to be closely-located to each other.

In the memory cell array 10 of the semiconductor integrated circuit according to this embodiment, the plurality of memory cells MC1 and MC2 are connected to the two program power supplies PV1 and PV2, respectively. Furthermore, the plurality of memory cells MC1 and MC2 are connected to the common bit lines BL1 and BL2.

In the semiconductor integrated circuit according to this embodiment, since the memory cells MC1 and MC2 and the memory cell array 10 have the above-described circuit configuration, resistance states of the two or more resistance change type memory elements can be changed by the single program operation, and predetermined data can be written into the plurality of memory cells MC1 and MC2.

As a result, a speed of a program operation of the semiconductor integrated circuit can be increased. Moreover, when the semiconductor integrated circuit according to this embodiment is used for the FPGA, a configuration time of the FPGA can be reduced.

Therefore, according to the semiconductor integrated circuit of this embodiment, operation characteristics of the memory in the circuit can be improved.

(c) Operations

Operations of the semiconductor integrated circuit according to this embodiment will now be described with reference to FIG. 7 to FIG. 14. It is to be noted that, to clarify the ON state/OFF state of each transistor, a circuit symbol of a switch is illustrated in place of a circuit symbol of the transistor depicted in FIG. 1 or FIG. 6.

Additionally, since the path transistor as the path switch does not contribute to the program operation in the description of the program operation for the memory cells and the resistance change type memory elements, the illustration of the path transistor is omitted in FIG. 7 to FIG. 11.

(c-0) Basic Operation

A basic operation of the semiconductor integrated circuit according to this embodiment will now be described with reference to FIG. 7 and FIG. 8. As the basic operation, a data write operation (a program operation of the circuit) with respect to the two resistance change type memory elements R1 and R2 in one memory cell MC will be explained. Here, a description will be given as to an example where the resistance change type memory elements R1 and R2 are bipolar resistance change type memory elements (variable resistance elements).

At the time of a program operation with respect to the memory cell MC, the program power supplies PV1 and PV2 are used.

In the transistors (the select transistors) M2 and M3 in the memory cell MC, one of the transistor M2 and the transistor M3 is selectively activated by the control circuit 20 during the program operation for the memory cell MC in accordance with data to be written.

That is, one of the transistors is turned on and the other of the same is turned off by a control signal input to the gate of the transistors. In the program operation, the two transistors M2 and M3 in the one memory cell MC as a write target are not simultaneously turned on or off.

As a result, the predetermined program voltage Vh or Vl is applied to the connection node N1 of the two resistance change type memory elements R1 and R2 from the program power supply PV1 or PV2 via the ON transistor. As described above, the program voltage Vh is higher than the program voltage Vl.

It is to be noted that the program voltage Vh is a positive voltage (Vh>0) and the program voltage Vl is a negative voltage (Vl<0) to simplify the explanation here. Further, a potential of a terminal on a side where the connection node N1 of the resistance change type memory elements R1 and R2 is not formed is set to a floating state or a ground potential (0 V).

First, an operation when the transistor M2 is tuned on (the transistor M3 is in the OFF state) will be explained.

When the transistor M2 has been turned on, the program power supply PV1 is electrically connected to the connection node N1, and the positive program voltage Vh is applied to the connection node N1.

Figure 7:
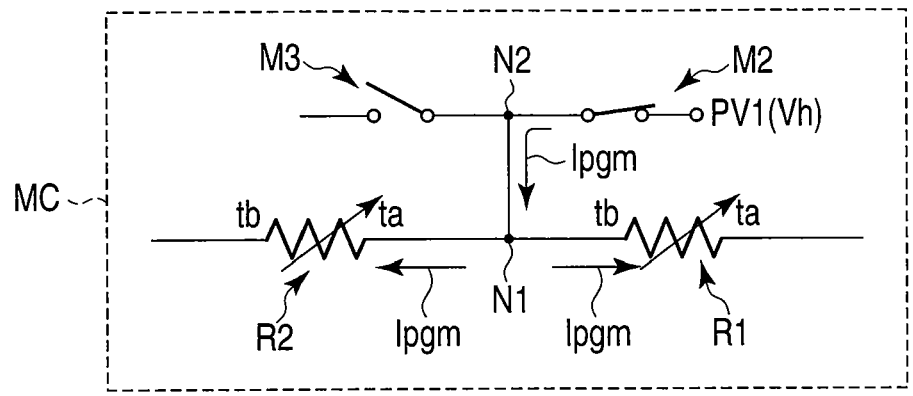
FIG. 7 and FIG. 8 are views for explaining operational examples of the memory cell in the semiconductor integrated circuit according to an embodiment.
Figure 8:
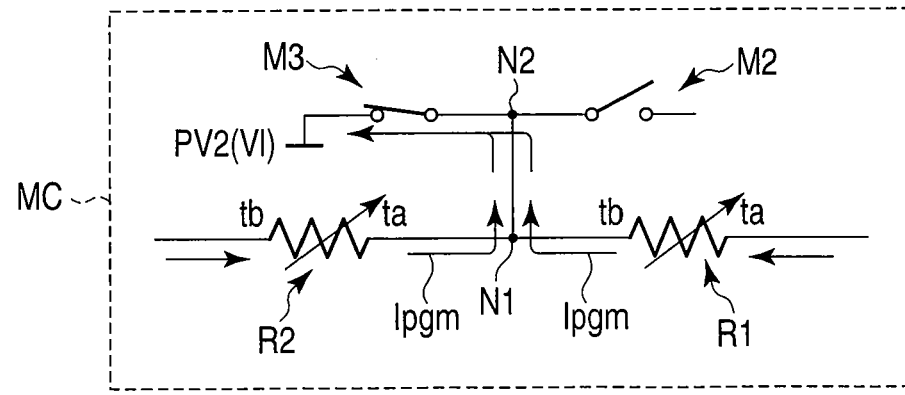

In this case, as shown in FIG. 7, a current Ipgm (which will be referred to as a program current hereinafter) resulting from the program voltage Vh flows from the positive program voltage Vh (Vh>0) side toward the ground voltage Vss (0 V) side through the connection node N1.

As described above, the connection node N1 is formed when the terminals ta and tb having different polarities in the two resistance change type memory elements R1 and R2 are connected.

Therefore, the program current Ipgm flows through the resistance change type memory element R1 from the terminal tb toward the terminal ta of the resistance change type memory element R1. On the other hand, the program current Ipgm flows through the resistance change type memory element R2 from the terminal ta toward the terminal tb of the resistance change type memory element R2.

That is, a voltage pulse having a polarity flowing from the terminal tb toward the terminal ta is applied to the resistance change type memory element R1, and a voltage pulse having a polarity flowing from the terminal ta toward the terminal tb is applied to the resistance change memory element R2.

As a result, in the two resistance change type memory elements R1 and R2 in the single memory cell Mc, the resistance change type memory element R1 changes from a high-resistance state to a low-resistance state if a resistance state of the resistance change type memory element R1 is the high-resistance state, or the low-resistance state is maintained if the resistance state of the resistance change type memory element R1 is the low-resistance state. The other resistance change type memory element R2 changes from the low-resistance state to the high-resistance state if a the resistance state of the resistance change type memory element R2 is the low-resistance state, or the high-resistance state is maintained if the resistance state of the resistance change type memory element R2 is the high-resistance state.

An operation when the transistor M3 is turned on (the transistor M2 is in the OFF state) will now be explained.

When the transistor M3 has been turned on, the power supply PV2 is electrically connected to the connection node N1, and the negative program voltage Vl is applied to the connection node N1.

In this case, the current Ipgm flows from the ground voltage Vss (or the floating state) side toward the negative program voltage Vl (Vl<0).

Therefore, the program current Ipgm flows through the resistance change type memory element R1 from the terminal ta toward the tb of the resistance change type memory element R1. On the other hand, the program current Ipgm flows through the resistance change type memory element R2 from the terminal tb toward the terminal ta of the resistance change type memory element R2.

That is, a voltage pulse having a polarity flowing from the terminal ta toward the terminal tb is applied to the resistance change type memory element R1, and a voltage pulse having a polarity flowing from the terminal tb toward the terminal ta is applied to the resistance change memory element R2.

As a result, in the two resistance change type memory elements R1 and R2 in the single memory cell MC, the resistance change type memory element R1 changes from a low-resistance state to a high-resistance state if a resistance state of the resistance change type memory element R1 is the low-resistance state, or the high-resistance state is maintained if the resistance state of the resistance change type memory element R1 is the high-resistance state. The other resistance change type memory element R2 changes from the high-resistance state to the low-resistance state if a the resistance state of the resistance change type memory element R2 is the high-resistance state, or the low-resistance state is maintained if the resistance state of the resistance change type memory element R2 is the low-resistance state.

Based on the program operation for the memory cell MC, at the time of holding data in the memory cell MC, the resistance change type memory elements R1 and R2 in the memory cell MC indicate resistance states different from each other. For example, when the resistance change type memory element R1 indicates the high-resistance state (data "1" is held), the resistance change type memory element R2 indicates the low-resistance state (data "0" is held). Contrarily, when the resistance change type memory element R1 indicates the low-resistance state (the data "0" is held), the resistance change type memory element R2 indicates the high-resistance state (data "1" state). However, in a transient state during writing data in the resistance change type memory element, these memory elements may temporarily indicate the same resistance state (the same data). It is to be noted that a situation that the resistance change type memory element is in the high-resistance state is described as holding the data "1", and a situation that the resistance change type memory element is in the low-resistance state is described as holding the data "0", but these situations represent states of the resistance change type memory elements, and they do not directly represent data that should be stored in the memory cell MC according to this embodiment.

It is to be noted that a relationship between an applying direction of the voltage/current and the operation of changing the resistance states of the resistance change type memory elements R1 and R2 is of course reversed in accordance with a connection relationship between polarities of the terminals of the resistance change type memory elements R1 and R2.

In the memory cell MC included in the semiconductor integrated circuit according to this embodiment, the two resistance change type memory elements R1 and R2 are connected to each other in such a manner that polarities of the terminals of the two resistance change type memory elements are opposite with respect to the program power supplies PV1 and PV2. As a result, voltage pulses having polarities opposite to each other are applied to the two resistance change type memory elements R1 and R2 in the single memory cell MC.

Therefore, a set operation for the one resistance change type memory element and a reset operation for the other resistance change type memory element are substantially simultaneously executed with respect to the two resistance change type memory elements in the single memory cell MC by one applying operation of the program voltage. Therefore, a speed of the program operation for the memory cell MC can be increased.

(c-1) Operational Example 1

An operation of the memory cell array according to this embodiment will now be explained with reference to FIG. 9. Here, a description will be given as to a program when each resistance change type memory element in the memory cell is a bipolar resistance change type memory element (a variable resistance element).

ON/OFF (the low-resistance state/high-resistance state) of the resistance change type memory element which is of the bipolar type is switched depending on an applying direction of the program voltage (a polarity of the voltage) with respect to the element.

When data is written into each of the memory cells MC1 and MC2 in the memory cell array 10, a memory cell (a selected cell) as a data write target is connected to each power supply that outputs the predetermined program voltage.

In the example shown in FIG. 9, of the two memory cells MC1 and MC2, the one memory cell MC1 selects the program voltage Vl and the other memory cell MC2 selects the program voltage Vh under control of the control circuit 20. A potential difference between the program voltage Vh on the high-potential side and the program voltage Vl on the low-potential side is large enough to change resistance states of the resistance change type memory elements $R1_1$, $R1_2$, $R2_1$, and $R2_2$. Therefore, as long as the program voltage Vh is higher than the program voltage Vl on the low-potential side, an intensity of the program voltage Vl may have a positive value or a negative value.

Here, at the time of the program operation in this embodiment, a memory sell for which the program power supply PV1 (the program voltage Vh) on the high-potential side has been selected will be referred to as a high-potential selected cell, and a memory cell for which the program power supply PV2 (the program voltage Vl) on the low-potential side has been selected will be referred to as a low-potential selected cell.

At the time of the program operation (writing data) of the memory cell array 10, a control signal is input to the control gate of each of the power supply switches SW1 and SW2 from the control circuit 20, whereby the control circuit 20 turns off the power supply switches SW1 and SW2, respectively. Therefore, the drive power supplies V1 and V2 are electrically disconnected from the bit lines BL1 and BL2.

A selection signal from the control circuit 20 is input to the control gate of each of the transistors $M2_1$, $M2_2$, $M3_1$, and $M3_2$ of the memory cells MC1 and MC2, thereby controlling ON/OFF of the transistors $M2_1$, $M2_2$, $M3_1$, and $M3_2$.

In FIG. 9, program currents Ipgm1 and Ipgm2 flow from the program power supply PV1 of memory cell (the high-potential selected cell) MC2 to the program power supply PV2 of the memory cell (the low-potential selected cell) MC1.

In the memory cell MC2 as the high-potential selected cell, the transistor $M2_2$ connected to the program power supply PV1 on the high-potential side is turned on by control of the control circuit 20. On the other hand, in the high-potential selected cell MC2, the transistor $M3_2$ connected to the program power supply PV2 on the low-potential side is in the OFF state. The program power supply PV1 enters the conductive state with respect to the memory cell MC2, and the program voltage Vh is applied to the memory cell MC2. As a result, the program current Ipgm is supplied into the memory cell MC2.

In the memory cell MC2, the program current Ipgm is split at a node $N1_2$, and program currents Ipgm1 and Ipgm2 flow toward the two resistance change type memory elements $R1_2$ and $R2_2$ in the memory cell MC, respectively. Here, in the common memory cell MC2, currents that are opposite to polarities of terminals of the resistance change type memory elements $R1_2$ and $R2_2$ flow through the resistance change type memory elements $R1_2$ and $R2_2$.

In the memory cell MC2, the program current Ipgm1 flows through the resistance change type memory element $R1_2$ in a direction extending from the terminal tb toward the terminal ta, and the program current Ipgm2 flows through the resistance change type memory element $R2_2$ in a direction extending from the terminal to toward the terminal tb.

That is, voltage pulses having polarities opposite to each other are applied to the resistance change type memory elements $R1_2$ and $R2_2$ in the same memory cell MC2, respectively. As described above, in the memory cell MC2 connected to the program power supply PV1 (Vh), the resistance change type memory element $R1_2$ changes to the low-resistance state, and the resistance change type memory element $R2_2$ changes to the high-potential state.

As a result, different pieces of data (respective pieces of data "0" and "1" having a complementary relationship) are written into the two resistance change type memory elements $R1_2$ and $R2_2$ in the high-potential selected cell, and the two resistance change type memory elements $R1_2$ and $R2_2$ indicate different resistant states.

It is to be noted that intensities (current values) of the program currents Ipgm1 and Ipgm2 flowing through the resistance change type memory elements $R1_2$ and $R2_2$ in the memory cell MC2 differ depending a resistance state (a resistance value) of the resistance change type memory element $R1_2$ and a resistance state (a resistance value) of the resistance change type memory element $R2_2$ or resistance states of other resistance change type memory elements in, e.g., the memory cell MC1.

The program currents Ipgm1 and Ipgm2 output from the high-potential selected cell MC2 are supplied to the low-potential selected cell (the memory cell MC1 in this example) through the bit lines BL1 and BL2, respectively.

In the memory cell MC1 as the low-potential selected cell, the transistor $M2_1$ connected to the program power supply PV1 on the high-potential side is in the OFF state, and the transistor $M3_1$ connected to the program power supply PV2 on the low-potential side is in the ON state. Therefore, the program power supply PV2 becomes electrically conductive with the memory cell MC1, and the program voltage Vl is applied to the memory cell MC1.

The program current Ipgm1 that has flowed through the bit line BL1 is supplied to the resistance change type memory element $R1_1$ in the low-potential selected cell MC1. The program current Ipgm2 that has flowed through the bit line BL2 is supplied to the resistance change type memory element $R2_1$ in the low-potential selected cell MC1. The terminal to of the resistance change type memory element $R1_1$ is connected to the bit line BL1, and the terminal tb of the resistance change type memory element $R2_1$ is connected to the bit line BL2.

The program current Ipgm1 flows from the terminal ta to the terminal tb of the resistance change type memory element $R1_1$. Contrarily, the program current Ipgm2 flows from the terminal tb toward the terminal ta of the resistance change type memory element $R2_1$.

Therefore, in the memory cell MC1 as the low-potential selected cell, a resistance state of the resistance change type memory element $R1_1$ on the bit line BL1 side changes to the high-resistance state (the data "1"), and a resistance state of the resistance change type memory element $R2_1$ on the bit line BL2 side changes to the low-resistance state (the data "0").

As described above, in the low-potential selected cell, like the high-potential selected cell, currents (voltages) having polarities opposite to each other are supplied to the two resistance change type memory elements $R1_1$ and $R2_1$ in the single memory cell.

As a result, different pieces of data (data having a complementary relationship) are written into the two resistance change type memory elements in the low-potential selected cell, and the two resistance change type memory elements in the low-potential selected cell indicate different resistance states.

According to this operational example, in the memory cell MC2 that has selected the program voltage Vh on the high-potential side and the memory cell MC1 that has selected the program voltage Vl on the low-potential side, resistance states of the two resistance change type memory elements in the high-potential selected cell are opposite to resistance states of the two resistance change type memory elements in the low-potential selected cell. That is, different pieces of data are written into the high-potential selected cell and the low-potential selected cell, and these memory cells enter different program states. Data stored in the memory cell will be described later.

When the program operation using the program voltage Vh on the high-potential side is executed with respect to all selected cells in the memory cell array 10, the dummy cell DC selects the power supply V6 on the low-potential side. Contrarily, when the program operation using the program voltage Vl on the low-potential side is executed with respect to all selected cells in the memory cell array 10, the dummy cell DC selects the power supply V5 on the high-potential side.

It is to be noted that memory cells into which no data is written (which will be referred to as non-selected cells) are electrical disconnected from the program power supplies PV1 (Vh) and PV2 (Vl) by turning off the transistors M2 and M3. As a result, a current (a voltage) whose intensity is sufficiently high to change resistance states of the resistance change type memory elements in the non-selected cells are not supplied to the non-selected cells, and data is not written into the resistance change type memory elements in the non-selected cells.

Although FIG. 9 shows the example where the program operation is simultaneously executed with respect to the two memory cells MC1 and MC2, data can be collectively written into three or more memory cells based on the single program operation by appropriately selecting the program voltage PV1 (Vh) and the program voltage PV2 (Vl) in the three or more memory cells.

However, when collectively writing data into a plurality of memory cells that share the bit lines BL1 and BL2, considering the following matters is preferable.

In a plurality of memory cells connected to the common bit lines BL1 and BL2, when the number of memory cells (the high-potential selected cells) that select the high-potential program power supply PV1 (Vh) is not equal to the number of memory cells (low-potential selected cells) that select the low-potential program power supply PV2, the balance between current supply and current draw (absorption) collapses in the program current output from each of the high-potential selected cells and the program current input to each of the low-potential selected cells. This collapse may possibly cause prevention of supply of the program current sufficient for the program operation to a given memory cell.

In such a case, the dummy cell is selected (activated), and compensating the current for the fewer selected cells in high- and low-potential selected cells enables coping with insufficiency of the program current (the program voltage).

For example, when the number of memory cells that select the program voltage Vh on the high-potential side is four and the number of memory cells that select the program voltage Vl on the low-potential side is one, the number of the memory cell on the low-potential side is smaller than the number of the memory cells on the high-potential side by three. In this case, when the dummy cell is selected as a cell on the low-potential side and the transistor DM2 connected to the power supply on the low-potential side is turned on, the insufficient current on the draw side (the low-potential cell) can be complemented.

As a size (for example, a channel width) of each of the transistors (the selected transistors) $M2_1$, $M3_1$, $M2_2$, and $M3_2$ in each memory cell MC1 or MC2, a size that substantially enables applying the predetermined programming voltage/current to the resistance change type memory elements of each cell can suffice.

On the other hand, a size (for example, a channel width) of each of the transistors DM1, DM2, DM3, and DM4 of the dummy cell DC must be a size that can cover a current amount which may be possibly complemented by the dummy cell DC. That is, it is preferable for the size of each transistor in the dummy cell DC to be larger than the size of each transistor in the memory cell MC1 or MC2.

Considering the worst case, all the memory cells may possibly select the high-potential program voltage Vh or the low-potential program voltage Vl. Therefore, if the number of the memory cells MC connected to the common bit lines BL1 and BL2 is N, it is preferable for the size of each of the transistors DM1, DM2, DM3, and DM4 in the dummy cell DC to be N-fold of the size of each transistor in each memory cell MC. It is to be noted that two or more dummy cells may be provided in the single memory cell array 10 in accordance with a voltage/current supply capacity of each dummy cell.

After the resistance state of each resistance change type memory element has been changed and the memory cell has changed to a predetermined program state, the control circuit 20 electrically disconnects the program power supply from the memory cell.

As described above, the plurality of memory cells are changed to different data holding states by the single program operation.

According to this operational example, the semiconductor integrated circuit according to this embodiment can simultaneously select the plurality of memory cells for writing from the plurality of memory cells connected to the common bit lines BL1 and BL2. That is, the semiconductor integrated circuit according to this embodiment can collectively write data into the plurality of memory cells MC1 and MC2 connected to the common bit lines BL1 and BL2. As a result, a speed of the program operation for the memory cell array can be increased.

Furthermore, when the transistors M2 and M3 in the memory cells are utilized to select the program voltages PV1 and PV2 applied to the memory cells, pieces of data (information) that differ depending on each memory cell can be simultaneously written into the memory cells connected to the common bit lines.

Therefore, in the semiconductor integrated circuit according to this embodiment, a speed of the data write operation (the program operation) for the plurality of memory cells can be increased. When the memory cells in the semiconductor integrated circuit according to this embodiment are used for the FPGA, a configuration time of this FPGA can be reduced.

(c-2) Operational Example 2

Operational Example 2 of the semiconductor integrated circuit according to this embodiment will now be explained. Here, a description will be given as to a situation where the resistance change type memory element is a unipolar resistance change type memory element (a variable resistance element). Operations equal to the operations explained in conjunction with FIG. 9 will be described as required.

In this example, the power supply V6 in the dummy cell DC outputs a ground potential Vss. Further, an intensity of the program voltage Vl on the low-potential side is different from the ground potential Vss.

As described above, when the unipolar resistance change type memory elements are used in the memory cells MC1 and MC2, a program voltage having a voltage value that differs depending on the reset operation and the set operation (a potential difference) is applied to the resistance change type memory elements. Therefore, in this Operational Example 2, the dummy cell DC provided in the memory cell array 10 is utilized to separately execute data writing with respect to the resistance change type memory elements $R1_1$ and $R1_2$ on the bit line BL1 side and the resistance change type memory elements $R2_1$ and $R2_2$ on the bit line BL2 side in each of the memory cells MC1 and MC2. However, data is collectively written into the plurality of memory cells MC1 and MC2 like Operational Example 1. It is to be noted that a change in resistance state of the unipolar resistance change type memory element is not dependent on a polarity of the voltage (a direction along which the current flows) as described above.

In FIG. 10, a description will be given as to a case that the memory cell MC1 has selected the program power supply PV2 (the program voltage Vl) and the memory cell MC2 has selected the program power supply PV1 (the program voltage Vh). It is to be noted that a situation where data is simultaneously written into the two memory cells will be described, but data can be of course simultaneously written into three or more memory cells by substantially the same operation.

As shown in FIG. 10, the memory cell MC1 selects the program voltage Vl, and the memory cell MC2 selects the program voltage Vh. Further, the dummy cell DC selects the ground potential Vss. In this case, a program current IpgmA flows from the high-potential selected cell MC2 toward the dummy cell DC, and a program current IpgmB flows from the low-potential selected cell MC1 toward the dummy cell DC.

The program current IpgmA is supplied to the resistance change type memory element $R2_2$ in the high-potential selected cell MC2 through the node $N1_2$. The program current IpgmB is supplied to the resistance change type memory element $R2_1$ in the low-potential selected cell MC1. Furthermore, a current V' is supplied to the dummy cell DC.

In this case, a voltage "Vl-Vss" is applied to the resistance change type memory element $R2_1$ on the bit line BL2 side in the low-potential selected cell MC1, and a voltage "Vh-Vss" is applied to the resistance change type memory element $R2_2$ on the bit line BL2 side in the high-potential selected cell MC2. Therefore, in the respective memory cells MC1 and MC2, intensities of the program currents IpgmA and IpgmB are different from each other, and different pieces of data are simultaneously written into the resistance change type memory elements $R2_1$ and $R2_2$ having the terminals tb connected to the bit line BL2.

However, in this Operational Example 2, considering potential levels of the bit lines BL1 and BL2 is preferable. A current $I'_2$ flows through the bit line BL1 in a direction extending from the program power supply PV1 of the memory cell MC2 toward the power supply PV2 of the memory cell MC1. Therefore, a potential generated due to the current $I'_2$ is applied to one end of each of the resistance change type memory elements $R1_1$ and $R1_2$ on the bit line BL1 side. As a result, a voltage value (a potential) associated with resistance values of the resistance change type memory elements $R1_1$ and $R1_2$ connected in series between the program power supply PV1 of the memory cell MC2 and the power supply PV2 of the memory cell MC1 is generated in the bit line BL1. In the worst case, a voltage (Vh-Vl) is applied to the memory elements $R1_1$ and $R1_2$ in the high-resistance state.

Therefore, when collectively performing the program operation with respect to the plurality of memory cells using the unipolar resistance change type memory elements, it is preferable for each resistance change type memory element to have both characteristics that data is written (a resistance state is changed) based on a potential difference (Vh-Vss) or (Vl-Vss) between the program voltage Vh or Vl and the ground voltage Vss and characteristics that data is not written (a resistance state is hardly changed) in regard to a potential difference (Vh-Vl) between the high-potential program voltage Vh and the low-potential program voltage Vl. Using the resistance change type memory elements having such characteristics in the memory circuit can contribute to stabilization of operations of the memory and improvement in reliability.

As a program operation for the unipolar resistance change type memory elements different from the operation depicted in FIG. 10, a program operation of independently executing data writing using the high-potential program voltage Vh and data writing using the low-potential program voltage Vl is used in the semiconductor integrated circuit according to this embodiment. In this case, a write operation using the high-potential program voltage and a write operation using the low-potential program voltage are executed with respect to the resistance change type memory elements in one column each having one end connected to the same bit line, respectively. The specific operations are as follows.

First, with regard to the resistance change type memory elements $R2_1$ and $R2_2$ directly connected to the bit line BL2, data writing using the high-potential program voltage Vh is executed to the memory cell selected by the control circuit 20. Then, with regard to the resistance change type memory elements $R2_1$ and $R2_2$ directly connected to the bit line BL2, data writing using the low-potential program voltage Vl is executed to the memory cell selected by the control circuit 20.

After completion of the data writing with respect to the resistance change type memory elements on the bit line BL2 side, data writing with respect to the resistance change type memory elements on the bit line BL1 starts.

With regard to the resistance change type memory elements $R1_1$ and $R1_2$ directly connected to the bit line BL1, data writing using the high-potential program voltage Vh is executed to the selected memory cell. Furthermore, with regard to the resistance change type memory elements $R1_1$ and $R1_2$ directly connected to the bit line BL1, data writing using the low-potential program voltage Vh is executed to the selected memory cell.

It is to be noted that, in the data writing executed four times, the dummy cell DC is set to the low-potential (Vss) side, and the dummy cell DC is provided on the program current absorption side (sink side).

As described above, the program operation for the memory cell array 10 is completed by the data writing for the resistance change type memory elements executed four times.

It is to be noted that, if a memory cell which requires no data writing is present, for example, the program operation for the memory cell array 10 may be completed by the data writing executed twice, like an example that the program operation is completed by the data writing using the program voltage Vh for the bit line BL2 side and the data writing using the program voltage Vl for the bit line BL1 side.

As described above, when the respective data write operations using the high-potential and low-potential program voltages are executed in accordance with each of the bit lines BL1 and BL2, a write time increases as compared with a situation that data is collectively written into a plurality of selected cells.

However, since the single program operation for the memory cell array is completed by the data writing for the plurality of memory cells in the memory cell array 10 executed four times, the configuration time can be sufficiently reduced even though the unipolar resistance change type memory elements are used in the semiconductor integrated circuit according to this embodiment as compared with a situation that the program operation (the data writing) is executed in accordance with each memory cell.

As described above, the semiconductor integrated circuit according to this embodiment can use the unipolar resistance change type memory elements without being restricted to the bipolar resistance change type memory elements.

The semiconductor integrated circuit according to this embodiment can substantially simultaneously execute data writing with respect to the plurality of resistance change type memory elements even if the unipolar resistance change type memory elements are utilized.

Therefore, in the semiconductor integrated circuit according to this embodiment, a speed of the program operation for the plurality of memory cells can be increased, and the configuration time when this semiconductor integrated circuit is used as the FPGA can be reduced.

Additionally, in the semiconductor integrated circuit according to this embodiment, the memory cells using the unipolar resistance change type memory elements can be formed with the same circuit configuration as that of the memory cells and the memory cell array using the bipolar resistance change type memory elements. Therefore, even after development of a mask of the memory, the semiconductor integrated circuit using the unipolar resistance change type memory elements or the semiconductor integrated circuit using the bipolar resistance change type memory elements can be appropriately formed by only changing materials for forming the resistance change type memory elements.

(c-3) Operational Example 3

Figure 11:
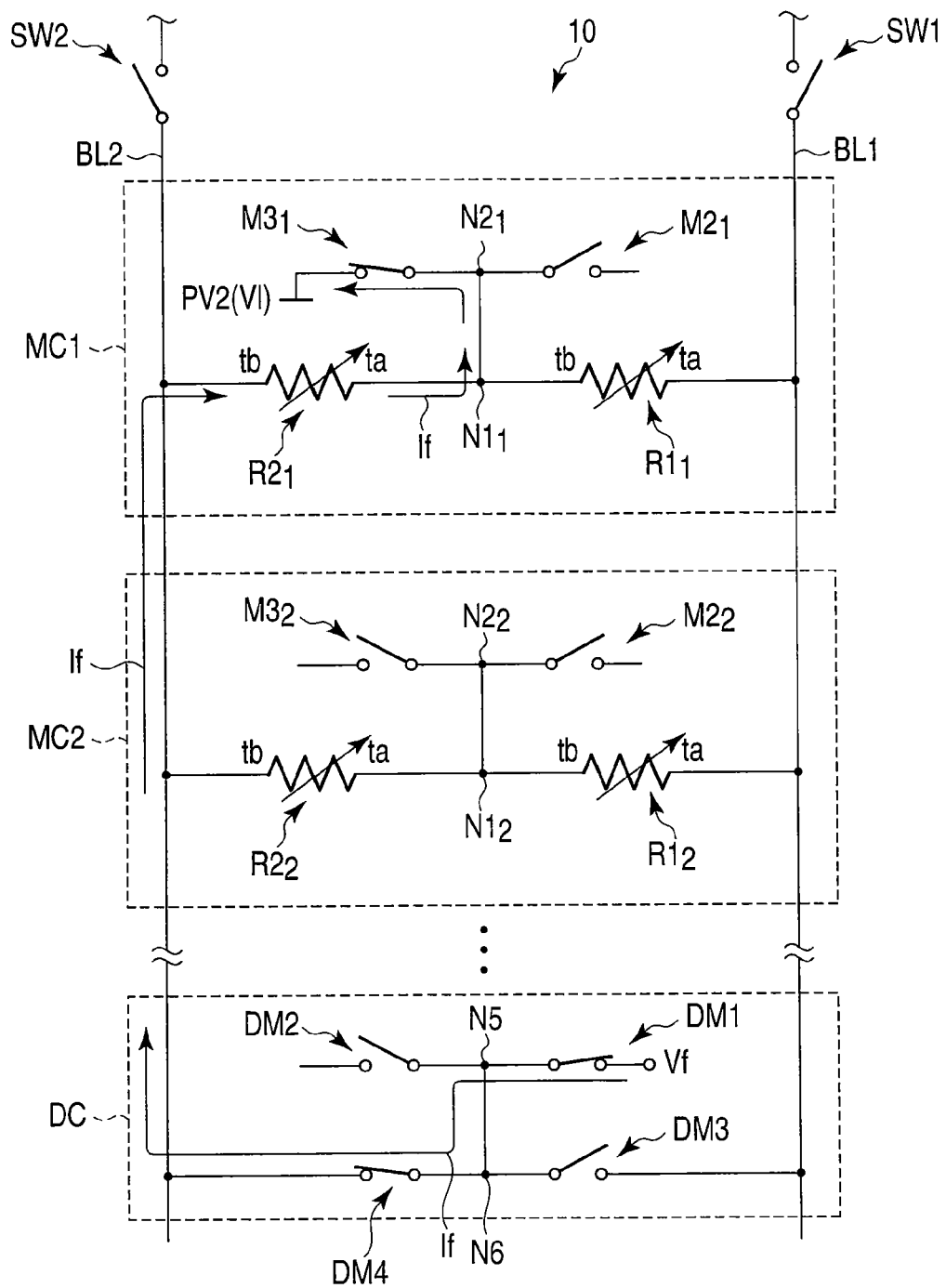
FIG. 11 is a view for explaining Operational Example 3 of the semiconductor integrated circuit according to an embodiment.

Operational Example 3 of the semiconductor integrated circuit according to this embodiment will now be described with reference to FIG. 11. Here, an initializing operation of the resistance change type memory elements will be explained. It is to be noted that operations equal to those explained in conjunction with FIG. 9 and FIG. 10 will be described as required.

In this operational example, as an initializing operation of the resistance change type memory elements, a forming operation will be exemplified.

The forming operation may be executed before using the resistance change type memory elements in accordance with constituent members of the resistance change type memory elements. A voltage/current for use in the forming operation may be different from the voltage/current used in the set/reset operation. The voltage used in the forming operation will be referred to as a forming voltage Vf. First, a situation where the forming voltage Vf is larger than the program voltage Vl on the low-potential side will be explained.

The forming operation for the resistance change type memory elements is executed by using, e.g., the dummy cell DC in the memory cell array. The transistor (a switch) in the dummy cell DC is connected to the power supply Vf for the forming operation.

At the time of the forming operation, the dummy cell DC outputs the forming voltage Vf under control of the control circuit 20.

Further, in a memory cell as a target of the forming operation (the memory cell MC1 in this example), the transistor connected to the power supply PV2 on the low-potential side is turned on, and the low-potential program voltage Vl is applied to the memory cell MC1.

As a result, a forming current If is generated in accordance with a potential difference between the forming voltage Vf and the voltage Vl, and this forming voltage If flows from the dummy cell DC to the selected cell MC1 through the bit line BL2.

The forming operation is executed by selecting the memory cells MC1 and MC2 one by one, and the forming voltage Vf and the forming current If are applied to the resistance change type memory elements in each memory cell. Which one of the bit lines BL1 and BL2 (the resistance change type memory elements) the forming current If is supplied to is controlled by transistors DM3 and DM4 in the dummy cell.

The forming voltage Vf can be a voltage sufficiently lower than the voltage Vh or the voltage Vl. In this case, the forming current If flows from the memory cell MC to the dummy cell DC through the bit line BL1 or the bit line BL2. In this case, a direction (a bit line) along which the forming current If flows is determined by characteristics of the resistance change type memory elements.

In this manner, the semiconductor integrated circuit according to this embodiment can execute the forming operation with respect to the memory cells using the resistance change type memory elements.

Furthermore, the operation of using the dummy cell DC to apply the voltage to each memory cell can be used as a function of remedying a write defect (which is called, e.g., a fail safe function) of the resistance change type memory elements when data cannot be collectively written into the memory cell for some reason in Operational Example 1 or Operational Example 2.

When data writing using the dummy cell DC is used in the semiconductor integrated circuit according to this embodiment in this manner, the reliability of the memory cells and the FPGA using these memory cells can be improved.

(c-4) Operational Example 4

Operational Example 4 of the semiconductor integrated circuit according to this embodiment will now be described with reference to FIG. 12. In this operational example, a judgment on data in each memory cell in the semiconductor integrated circuit according to this embodiment (a read operation) and an operation when the memory cell array 10 in the semiconductor integrated circuit according to this embodiment is used as a configuration memory of the FPGA (an FPGA operation) will now be explained.

As shown in FIG. 12, at the time of the read operation and the FPGA operation of the semiconductor integrated circuit according to this embodiment, the control circuit 20 turns on the power supply switch SW1 connected to the bit line BL1 and the power supply switch SW2 connected to the bit line BL2. As a result, the power supply voltage Vdd is applied to the bit line BL1 on the high-potential side, and a ground voltage Vss (=0 V) is applied to the bit line BL2 on the low-potential side.

In the plurality of memory cells MC1 and MC2 in the memory cell array 10, the control circuit 20 turns off the transistors $M2_1$, $M2_2$, $M3_1$, and $M3_2$, and the program power supplies PV1 and PV2 are electrically disconnected from the memory cells MC1 and MC2. Moreover, in the dummy cell DC, the transistors DM1, DM2, DM3, and DM4 as constituent elements are turned off, and the dummy cell DC is electrically disconnected from the bit lines BL1 and BL2.

In this case, in a connection relationship between the respective memory cells MC1 and MC2 and the bit lines BL1 and BL2, a circuit configuration that the two resistance elements (the resistance change type memory elements) $R1_1$ and $R2_1$ and the two resistance elements $R1_2$ and $R2_2$ are connected in series between the bit line BL1 on the high-potential side (the Vdd side) and the bit line BL2 on the low-potential side (the Vss side), respectively, is provided.

It is to be noted that a resistance state (a resistance value) of each resistance change type memory element must be hardly changed when the power supply voltage Vdd is applied to the memory cells MC1 and MC2, i.e., the power supply voltage Vdd must be smaller than a threshold value of the memory element.

In the memory cells MC1 and MC2, control gates of the path transistors $M1_1$ and $M1_2$ are connected to the connection nodes $N1_1$ and $N1_2$ of the two resistance change type memory elements $R1_1$ and $R2_1$ and the two resistance change type memory elements $R1_2$ and $R2_2$, respectively.

Here, a resistance value of each of the resistance change type memory element $R1_1$ and $R1_2$ is represented as "RVa", and a resistance value of each of the resistance change type memory element $R2_1$ and $R2_2$ is represented as "RVb".

According to the connection relationship depicted in FIG. 12, a voltage (a potential difference) between the bit line BL1 and the bit line BL2 is divided by the series-connected resistance change type memory elements $R1_1$ and $R2_1$ and the series-connected resistance change type memory elements $R1_2$ and $R2_2$. Therefore, a potential level Vx of the connection nodes $N1_1$ and $N2_2$ is represented as $\{RVb/(RVa+RVb)\}\times Vdd$.

Additionally, the two resistance change type memory elements $R1_1$ and $R2_1$ or the two resistance change type memory elements $R1_2$ and $R2_2$ in the memory cell hold respective pieces of complementary data ("0" or "1"). That is, in one memory cell, if one resistance change type memory element (the variable resistance element) has a high-resistance state (a high-resistance value Rh), the other resistance change type memory element has a low-resistance state (a low-resistance value Rl).

Therefore, the potential level Vx of the connection nodes $N1_1$ and $N1_2$ has an intensity that differs depending on resistance values of the two resistance change type memory elements in the memory cell.

When the resistance element (the resistance change type memory element) $R1_1$ or $R1_2$ between the power supply Vdd and the node $N1_1$ or $N1_2$ has a resistance value Rh (>Rl) and the resistance element (the resistance change type memory element) $R2_1$ or $R2_2$ between the ground power supply Vss and the node $N1_1$ or $N1_2$ has a resistance value Rl, a voltage $V_{FPGA1}$ of "$\{Rl/(Rh+Rl)\}\times Vdd$" is applied to the connection node $N1_1$ or $N1_2$.

On the other hand, when the resistance element $R1_1$ or $R1_2$ between the power supply Vdd and the node $N1_1$ or $N1_2$ has a resistance value Rl (<Rh) and the resistance element $R2_1$ or $R2_2$ between the ground power supply Vss and the node $N1_1$ or $N1_2$ has a resistance value Rh, a voltage $V_{FPGA2}$ of "$\{Rh/(Rh+Rl)\}\times Vdd$" is applied to the connection node $N1_1$ or $N1_2$. Since the resistance value Rh is higher than the resistance value Rl, the voltage $V_{FPGA2}$ is higher than the voltage $V_{FPGA1}$.

Intensities of the voltages $V_{FPGA1}$ and $V_{FPGA2}$ of the connection nodes N1 and N2 differ depending on resistance states of the two resistance change type memory elements in the memory cell. It is to be noted that a larger difference between a resistance value in the high-resistance state and a resistance value in the low-resistance value in the resistance change type memory elements can contribute to improvement in the reliability of the memory.

Here, an intensity of the voltage $V_{FPGA2}$ (a voltage value) is a value equal to or higher than a threshold value Vth of each of the path transistors $M1_1$ and $M1_2$, and an intensity of the voltage $V_{FPGA1}$ is a value smaller than the threshold value Vth of each of the path transistors $M1_1$ and $M1_2$. It is to be noted that the intensities of the voltages $V_{FPGA1}$ and $V_{FPGA2}$ can be controlled by appropriately setting the power supply voltage Vdd and the resistance values Rh and Rl of the resistance change type memory elements.

A situation that the resistance change type memory element $R1_1$ on the power supply side is in the high-resistance state (the resistance value Rh) and the resistance change type memory element $R2_1$ on the ground side is in the low-resistance state (the resistance value Rl) in the memory cell MC1 will now be considered.

In this case, the voltage $V_{FPGA1}$ is applied to the connection node $N1_1$. Since the voltage $V_{FPGA1}$ is smaller than the threshold value Vth of the path transistor $M1_1$, the path transistor $M1_1$ is not turned on. Therefore, interconnects connected to one end and the other end of a current path of the path transistor $M1_1$ do not enter a conductive state.

A situation that the resistance change type memory element $R1_2$ on the power supply side is in the low-resistance state (the resistance value Rl) and the resistance change type memory element $R2_2$ on the ground side is in the high-resistance state (the resistance value Rh) in the memory cell MC2 will now be considered.

In this case, the voltage $V_{FPGA2}$ is applied to the connection node $N1_2$. Since the voltage $V_{FPGA2}$ is equal to or higher than the threshold value Vth of the path transistor $M1_2$, the path transistor $M1_2$ is turned on. Therefore, interconnects connected to one end and the other end of a current path of the path transistor $M1_2$ enter a conductive state, and an FPGA signal flows through the interconnects via the ON path transistor $M1_1$.

In this manner, when each memory cell includes the two resistance change type memory elements $R1_1$ and $R2_1$ or the two resistance change type memory elements $R1_2$ and $R2_2$, the semiconductor integrated circuit according to this embodiment can control the conductive state of each of the path transistors $M1_1$ and $M1_2$ connected to the connection nodes $N1_1$ and $N1_2$ of these resistance change type memory elements.

Therefore, the memory cells and the memory cell array in the semiconductor integrated circuit in this embodiment can be driven as a configuration memory of the FPGA.

It is to be noted that data stored in each memory cell can be determined by associating a difference between the voltage values $V_{FPGA1}$ and $V_{FPGA2}$ in the connection nodes with the data. For example, data "1" can be assigned to the voltage $V_{FPGA1}$, and data "0" can be assigned to the voltage $V_{FPGA2}$. Since the resistance change type memory can control the resistance value of the resistance change type memory element by controlling an intensity of the program voltage at the time of data writing, a multilevel memory in which one memory cell stores data having two or more levels can be realized. It is to be noted that the data stored in the memory cell may be determined by associating ON/OFF of the path transistors $M1_1$ and $M1_2$ with the data.

As descried above, the semiconductor integrated circuit according to this embodiment can determine the data stored in the memory cell by utilizing a state that a potential in the connection node between the two resistance change type memory elements fluctuates in accordance with resistance values of the two resistance change type memory elements.

Further, the memory cells and the memory cell array according to this embodiment can be used as the configuration memory.

As described above, with regard to the memory cells and the memory cell array according to this embodiment, a speed of the program operation can be increased by collectively writing data into the plurality of memory cells. Therefore, in the FPGA using the semiconductor integrated circuit according to this embodiment, a configuration time can be shortened.

(c-5) Operational Example 5

Operational Example 5 of a semiconductor integrated circuit according to this embodiment will now be described with reference to FIG. 13 and FIG. 14. FIG. 13 and FIG. 14 are schematic views for explaining Operational Example 5 of the semiconductor integrated circuit according to this embodiment.

In the memory cell MC of the semiconductor integrated circuit according to this embodiment, two resistance change type memory elements R1 and R2 are nonvolatile memory elements. Therefore, when a circuit is not used, power gating that completely blocks supply of a power supply voltage to the memory cell MC can be adopted. This contributes to a reduction in power consumption of the semiconductor integrated circuit.

As described above, in a state where data is held in the memory cell, with regard to the two resistance change type memory elements R1 and R2, complementary data is programmed with respect to the two resistance change type memory elements in one memory cell in such a manner that one resistance change type memory element enters a high-resistance state and the other resistance change type memory element enters a low-resistance state.

However, when resistance values of the resistance change type memory elements R1 and R2 are relatively high irrespective of the low-resistance state and the high-resistance state of these resistance values, a rising/falling time of the memory cell (an interconnect) at the time of turning on/off the power supply increases due to a delay caused by resistances and capacitances.

As shown in FIG. 13, in the memory cell MC according to this embodiment, a node N1 is connected to the program power supplies PV1 and PV2 through the transistors M2 and M3. The semiconductor integrated circuit according to this embodiment can utilize this circuit configuration to shorten a rising time and a falling time of the memory cell MC.

For example, before (immediately before) the power supply voltage Vdd is supplied to a chip (the memory cell array), the control circuit 20 applies a control pulse (a control signal) PL1 to a gate of at least one of the transistors M2 and M3 in the memory cell MC. In FIG. 13, a control pulse PL1 that is utilized to turn on a transistor is input to a p-channel type transistor.

As a result, the transistors M2 or M3 or both are temporarily turned on, and the program power supplies PV1 or PV2 or both are electrically connected to the node N1.

Then, the voltages (programming voltages) Vh or Vl are applied to the connection node N1 through the ON transistors M2 or M3 during a period corresponding to a pulse width of the control pulse PL1.

Electric charges are stored in the node N1 by application of the voltages Vh or Vl in accordance with conduction times of the transistors M2 or M3. As a result, a potential Vx of the node N1 increases.

For example, a situation where a time elapses after the power supply voltage Vdd is blocked from the bit line BL1 and a potential in the node N1 is the ground potential Vss will now be considered. In this case, as compared with a case that the power supply voltage Vdd is supplied to the bit line BL and a potential level of the node N1 rises to a predetermined potential from the ground potential Vss (0 V), a rising time is shortened when the potential level of the node N1 rises to a predetermined potential from a state of the potential Vx (>Vss) by charging.

For example, as the potential Vx of the node N1 at the time of charging (a standby mode of the memory cell), approximately (Vdd−Vss)/2 is enough. Setting a pulse width or a pulse voltage of a control signal PL1 applied to the control gate of the transistor M2 to achieve this value can suffice.

When an n-channel type MOS transistor is used for each of the transistors M2 and M3 (see FIG. 4), after the control pulse is applied to the transistors M2 and M3, a potential of the node N1 is a voltage reduced by a threshold voltage of the n-channel type MOS transistor. Therefore, the potential of the node realized by charging may be set by adjusting the threshold voltage of the transistor.

Further, as shown in FIG. 14, the potential of the node N1 may be increased by supplying a control pulse PL2 (the potential) to a source/drain of the path transistor M1 or a substrate.

The control gate (a gate electrode) of the path transistor M1 is connected to the connection node N1. Therefore, even if almost no leak current flows between the source/drain of the path transistor M1 and the node N1 or between the substrate and the node N1, the connection node N1 is connected to the source/drain and the substrate through an electrostatic capacity (capacitive coupling).

For example, when a potential level of the source/drain of the path transistor M1 and the substrate (a channel region) is increased by a back bias, the potential level of the node N1 also rises in accordance with an intensity of the electrostatic capacity between the substrate and the gate electrode (the connection node). When the power supply voltage Vdd is applied to the memory cell MC in this state, like charging the node N1 with the program voltage PV1 or PV2, the potential level of the connection node N1 can be raised to a predetermined potential level in a shorter time than that in a case that the potential level of the node N1 rises from the state of the ground potential Vss.

As a result, at the time of power gating of the semiconductor integrated circuit, a rising/falling time of the connection node N1 in the memory cell MC can be reduced.

It is to be noted that, even in a case of lowering the potential level of the connection node N1 to the ground potential Vss from a given potential level (discharging electric charges in the node), the falling time of the potential level in the connection node N1 can be reduced by executing an operation opposite to the operation of charging the connection node N1.

For example, in the operation shown in FIG. 13, the control pulse can be supplied to the transistor M3 to discharge the electric charges in the node N1 to the low-potential end. Further, in the operational example shown in FIG. 14, a potential in the source/drain of the path transistor M1 or the substrate can be lowered to decrease the potential in the node N1 based on the capacitive coupling.

As described above, in the semiconductor integrated circuit according to this embodiment, at the time of the power gating of the circuit, an operation speed of the memory cell can be improved by charging the connection node with the electric charges or discharging the electric charges in the connection node N1.

(d) Modification

A modification of the memory cell according to this embodiment will now be described with reference to FIG. 15 and FIG. 16.

When an FPGA signal (a voltage or a current) reaches a path transistor (a path switch) M1, a potential level of a connection node N1 fluctuates due to a change in this signal and capacitive coupling of the path transistor M1. When a resistance value (an absolute value) of a resistance change type memory element in a memory cell MC is high, a time required for a potential fluctuation of the connection node N1 to enter a steady state increases due to interconnect delay. In a transient state before entering the steady state, the potential level of the node N1 fluctuates as an intermediate value between the ground potential Vss and the power supply potential Vdd, and this fluctuation causes leak of the FPGA signal (the current/voltage) or an increase in power consumption due to this leak. The potential fluctuation in the node N1 can be suppressed by increasing capacity components connected to the node N1.

FIG. 15 is an equivalent circuit diagram showing a capacity component C connected to the connection node N1 in the memory cell MC.

The capacity component C is caused by a junction capacitance of sources/drains (diffusion layers) of the two transistors M2 and M3 and the substrate or a parasitic capacitance between gates of the transistors M2 and M3 and the substrate.

In the semiconductor integrated circuit according to this embodiment, since the two transistors M2 and M3 are connected to the node N1, the junction capacitance caused by the transistors becomes relatively large. As a result, the capacity components C of the node N1 increase.

Therefore, in the resistance change memory according to this embodiment, increasing the capacity components of the node N1 enables reducing the potential fluctuation of the node N1, thereby suppressing rise of the power consumption.

In the memory cell MC shown in FIG. 15, each capacity component C connected to the connection node N1 may be the source/drain of the transistor as the transistor M2 or M3, the junction capacitance in the substrate, or the parasitic capacitance between the gate and the substrate as described above. Moreover, a MOS capacitor may be additionally provided. Further, a capacitance of an interconnect or a resistance change type memory element in a high-resistance state can be used as a capacitive element configured to form the capacity component C.

Increasing the capacity components C between the program power supplies PV1 and PV2 and the connection node N1 in this manner enables suppressing the potential fluctuation of the node N1 at the time of the FPGA operation, thereby suppressing an increase in power consumption.

Additionally, in the above example, the dummy cell is formed of the four transistors (the switches) while considering symmetry properties of an internal constitution thereof. However, like the dummy cell configured to adjust a current amount for the bipolar resistance change type memory elements, the transistors may have a function of electrically separating the bit line BL1 and the bit line BL2 alone.

In this case, as shown in FIG. 16, one of the transistors used in place of the resistance change type memory elements in the dummy cell DC may be deleted, and the transistors may be provided in the dummy cell DC in such a manner that a current path of one transistor DM3 can be connected in series between the bit lines BL1 and BL2. In this case, the dummy cell DC has three transistors.

(e) Conclusion

As described above, in the semiconductor integrated circuit according to this embodiment, the plurality of memory cells MC1 and MC2 are arranged in the memory cell array 10.

Each memory cell MC1 in the memory cell array 10 includes the two resistance change type memory elements $R1_1$ and $R2_1$ and the two switches (the transistors) $M2_1$ and $M3_1$. In the single memory cell MC, the two resistance change type memory elements and the two transistors have such a connection relationship as depicted in FIG. 1.

The resistance change type memory elements are provided on an interlayer insulating film that covers the transistor. Therefore, a cell size of each memory cell is determined based on a size of the two select transistors on the semiconductor substrate. Therefore, each memory cell according to this embodiment can be reduced to be smaller than a cell size of an SRAM.

As shown in FIG. 6, the plurality of memory cells MC1 and MC2 are connected to the common bit lines BL1 and BL2 in the memory cell array 10.

As described in conjunction with FIG. 7 to FIG. 10, the semiconductor integrated circuit according to this embodiment can collectively (substantially simultaneously) write data into the plurality of memory cells at the time of the program operation, thereby enabling the rapid program operation. For example, when the semiconductor integrated circuit according to this embodiment is used for the FPGA, a configuration time of the FPGA can be reduced.

Furthermore, as described with reference to FIG. 11, the semiconductor integrated circuit according to this embodiment can write data into one memory cell while using the dummy cell. Therefore, even if a write defect occurs due to collective writing, data can be individually written into a cell in which the write defect has occurred. Therefore, the resistance change memory according to this embodiment can assure the reliability of the operation.

Moreover, in the semiconductor integrated circuit according to this embodiment, a current utilized to write data into one memory cell is also used for writing data into other memory cells. Therefore, power consumption of the resistance change memory according to this embodiment can be reduced.

As described above, the semiconductor integrated circuit according to this embodiment can improve operation characteristics of the memory and the circuit using the memory.

(2) Application

An application of the semiconductor integrated circuit according to this embodiment will now be described with reference to FIG. 17.

FIG. 17 is an equivalent circuit diagram showing an application of the semiconductor integrated circuit according to this embodiment.

In FIG. 1 to FIG. 6, transistors M2 and M3 configured to output program voltages PV1 and PV3 are provided in each memory cell.

On the other hand, in a circuit depicted in FIG. 17, these transistors are shared by a plurality of memory cells aligned in a direction (a column direction) crossing an extending direction of bit lines BL1 and BL2.

Interconnects (which will be referred to as common interconnects) extending in the column direction are connected to a connection node of two transistors M2 and M3 associated with program power supplies PV1 and PV2. The plurality of memory cells aligned in the column direction are connected to the common interconnects SL1 and SL2.

In a circuit configuration depicted in FIG. 17, switches (transistors) $M4_1$, $M4_2$, $M4_3$, and $M4_4$ are provided in respective memory cells $MC1_1$, $MC2_1$, $MC1_2$, and $MC2_2$ to separate nodes $N1_1$, $N1_2$, $N1_3$, and $N1_4$ in the respective memory cells in accordance with each column. One end of a current path of each of the transistors $M4_1$, $M4_2$, $M4_3$, and $M4_4$ is connected to the common interconnect SL1 or SL2, and the other end of the current path of each of the transistors $M4_1$, $M4_2$, $M4_3$, and $M4_4$ is connected to the node $N1_1$. A selection signal (a control signal) from a control circuit 20 is input to a control gate of each of the transistors $M4_1$, $M4_2$, $M4_3$, and $M4_4$.

Each of these transistors $M4_1$, $M4_2$, $M4_3$, and $M4_4$ is used for selecting a column. As a result, a program voltage Vh or Vl can be supplied to a column selected by the control circuit 20 alone.

Further, with regard to dummy cells $DC1_1$ and $DC1_2$, power supplies V5 and V6 are also shared by the plurality of cells aligned in the column direction. The respective dummy cells $DC1_1$ and $DC1_2$ are connected to a common interconnect SLD through transistors DM6. The transistors DM6 control connection between the power supplies V5 and V6 and the dummy cells $DC1_1$ and $DC1_2$.

It is to be noted that operations for the memory cells and the memory cell array such as a program operation, a forming operation, and an FPGA operation are equal to those in the above examples, thereby omitting a description thereof.

In the semiconductor integrated circuit according to this application, operation characteristics of the memory and the circuit using this memory can be likewise improved.

(3) Specific Example

A specific example of the semiconductor integrated circuit according to this embodiment will now be described with reference to FIG. 18 and FIG. 19.

As described above, the semiconductor integrated circuit according to this embodiment can be applied as a resistance change type memory to a file memory or a work memory in place of a flash memory or a DRAM.

Alternatively, the semiconductor integrated circuit according to this embodiment can be used for the FPGA.

For example, when the semiconductor integrated circuit according to this embodiment is applied to a configuration memory that holds data in a look up table (LUT), the LUT having K inputs requires 2K memory cells MC. Therefore, when forming the memory cell array 10 depicted in FIG. 6, it is preferable to share bit lines BL1 and BL2 by the 2K memory cells MC determined as one unit.

Furthermore, in the semiconductor integrated circuit according to this embodiment, the memory cell MC can be used for a three-state buffer.

Figure 18:
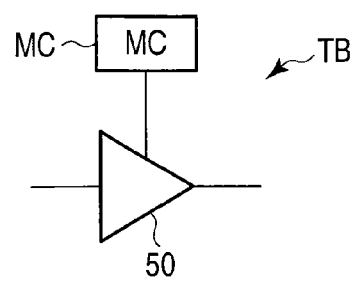
FIG. 18 and FIG. 19 are views for explaining an example of the application of the semiconductor integrated circuit according to an embodiment.

As shown in FIG. 18, a three-state buffer TB has a circuit configuration that the memory cell MC is connected to a control terminal of a buffer 50. A path transistor M1 connected to the memory cell MC is provided in the buffer 50 to connect the buffer 50 with the memory cell MC.

As described above, ON/OFF of the path transistor M1 can be controlled in accordance with a program state of the memory cell MC (a resistance state of each of the resistance change type memory elements R1 and R2). As a result, a low-impedance state/high-impedance state of the buffer 50 can be controlled in accordance with whether the path transistor M1 is ON or OFF.

As described above, the memory cell of the semiconductor integrated circuit according to this embodiment can be utilized to form the three-state buffer TB.

Figure 19:
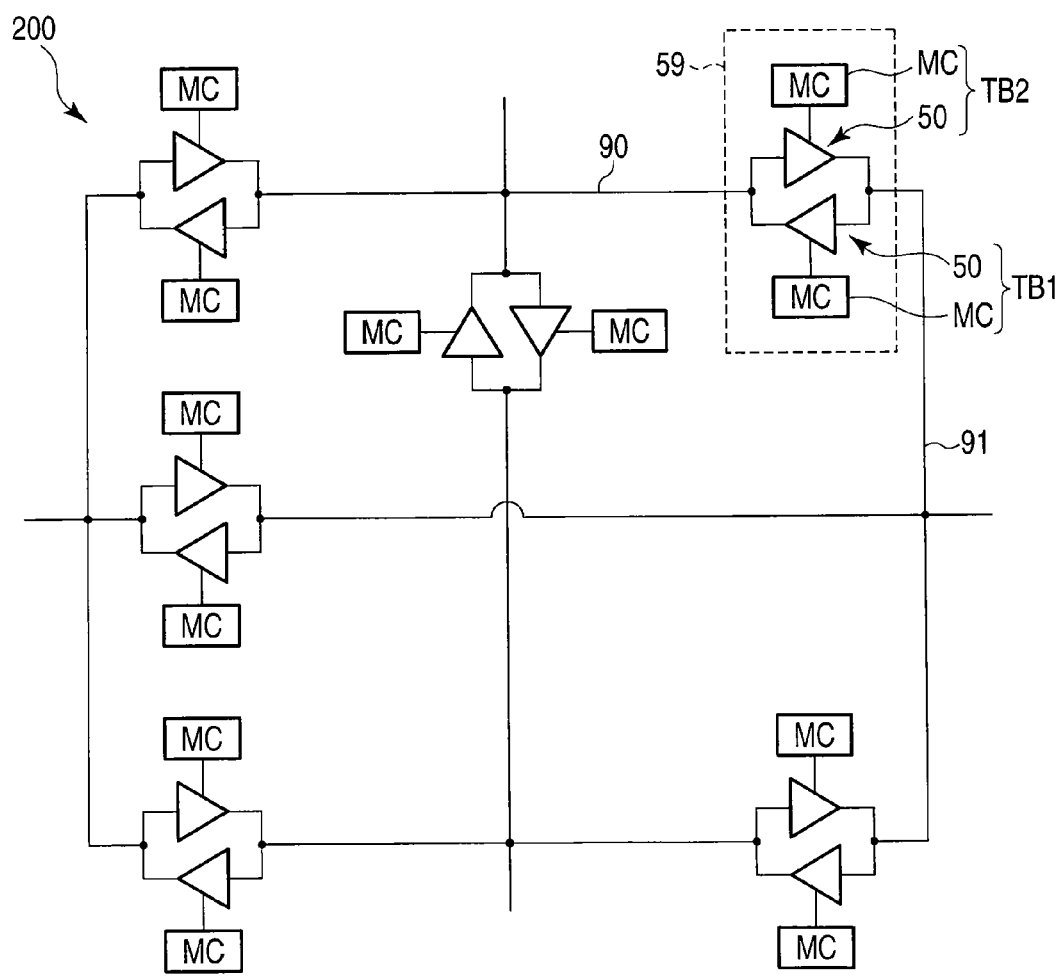

Additionally, FIG. 19 shows an example of a switch block 200 using each three-state buffer depicted in FIG. 18.

The switch block 200 in FIG. 19 includes 12 three-state buffers. That is, the switch block 200 includes 12 memory cells MC. For example, the 12 memory cells MC share the bit lines BL1 and BL2, and these memory cells MC form one unit (e.g., a memory cell array).

In the switch block 200 depicted in FIG. 19, two three-state buffers TB1 and TB2 form a bidirectional buffer circuit 59 as a switch.

The switch block 200 in FIG. 19 can flow a signal (a current) in both directions through respective interconnects 90 and 91 connecting the bidirectional buffer circuits 59 to each other. Each bidirectional buffer circuit 59 in the switch block 200 has a combinational relationship that one three-state buffer TB2 in the bidirectional buffer circuit 59 is not selected if the other three-state buffer TB1 in the same bidirectional buffer circuit 59 is selected. Therefore, the memory cell MC in the semiconductor integrated circuit according to this embodiment is suitable for use in such a switch block 200 that a signal (a current) flows through the interconnects 90 and 91 in both the directions as depicted in FIG. 19. Further, according to the switch block 200 shown in FIG. 19, a size of a transistor of a dummy cell in the memory cell array can be also reduced.

As described above, the semiconductor integrated circuit according to this embodiment can be applied to a memory device or an FPGA.

Others

Although the examples that the bipolar or unipolar variable resistance element is used as the resistance change type memory element have been described in this embodiment, a magnetoresistive effect element or a phase-change element may be used as the resistance change type memory element.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor integrated circuit comprising:
a first resistance change type memory element including a first terminal connected to a first power supply through a first power supply switch and a second terminal connected to a first node;
a second resistance change type memory element including a third terminal connected to the first node and a fourth terminal connected to a second power supply through a second power supply switch;
a first switch including a first control gate and a first current path, one end of the first current path being connected to a first program power supply, the other end of the first current path being connected to the first node; and
a second switch including a second control gate and a second current path, one end of the second current path being connected to the first node, the other end of the second current path being connected to a second program power supply configured to output a voltage value different from that of the first program power supply.

2. The circuit according to claim 1, wherein, when the first switch is turned on and the second switch is turned off,
the first program power supply is electrically connected to the first node through the first switch in the on-state,
after the first program power supply is connected to the first node,
a resistance value of the first resistance change type memory element indicates a first resistance value, and a resistance value of the second resistance change type memory element indicates a second resistance value larger than the first resistance value; and
when the first switch is turned off and the second switch is turned on,
the second program power supply is electrically connected to the first node through the second switch in the on-state,
after the second program power supply is connected to the first node,
the resistance value of the first resistance change type memory element indicates the second resistance value, and the resistance value of the second resistance change type memory element indicates the first resistance value.

3. The circuit according to claim 1, further comprising:
a third switch including a third current path and a third control gate connected to the first node.

4. The circuit according to claim 3, wherein, in a situation that the first and second power supplies are electrically connected to the first node,
the third switch is turned on when the resistance value of the first resistance change type memory element is a first resistance value and the resistance value of the second resistance change type memory element is a second resistance value larger than the first resistance value, and
the third switch is turned off when the resistance value of the first resistance change type memory element is the second resistance value and the resistance value of the second resistance change type memory element is the first resistance value.

5. The circuit according to claim 1, wherein, when the first and second power supplies are electrically disconnected from the first node,
a pulse voltage is applied to at least one of the first and second control gates to charge the first node.

6. The circuit according to claim 3, wherein, when the first and second power supplies are electrically disconnected from the first node,
a pulse voltage is applied to the third switch, and the first node is charged based on capacitive coupling of the third switch and the first node.

7. The circuit according to claim 1, wherein the resistance values of the first and second resistance change type memory elements change in accordance with a voltage flowing from a terminal having a first polarity toward a terminal having a second polarity or a voltage flowing from the terminal having the second polarity toward the terminal having the first polarity, and
the second terminal and the third terminal connected to the first node are terminals having polarities different from each other.

8. A semiconductor integrated circuit comprising:
first and second control lines;
a first power supply connected to the first control line through a first power supply switch;

a second power supply connected to the second control line through a second power supply switch;

first and second memory cells connected in parallel between the first and second control lines, each of the first and second memory cells including first and second resistance change type memory elements and first and second switches;

at least one dummy cell connected to a position between the first and second control lines;

a first program power supply connected to the first and second memory cells and configured to output a first voltage;

a second program power supply connected to the first and second memory cells and configured to output a second voltage different from the first voltage; and a third program power supply connected to the dummy cell through a dummy cell switch, wherein, in each of the first and second memory cells, a first terminal of the first resistance change type memory element is connected to the first control line, a second terminal of the first resistance change type memory element is connected to a first node, a third terminal of the second resistance change type memory element is connected to the first node, a fourth terminal of the second resistance change type memory element is connected to the second control line, one end of the first switch is connected to the first program power supply, the other end of the first switch is connected to the first node, one end of the second switch is connected to the first node, and the other end of the second switch is connected to the second program power supply.

9. The circuit according to claim 8, wherein, when the first program power supply is electrically connected to the first node, a resistance value of the first resistance change type memory element changes from a first resistance value to a second resistance value larger than the first resistance value, and a resistance value of the second resistance change type memory element changes from the second resistance value to the first resistance value; and when the second program power supply is electrically connected to the first node, the resistance value of the first resistance change type memory element changes from the second resistance value to the first resistance value, and the resistance value of the second resistance change type memory element changes from the first resistance value to the second resistance value.

10. The circuit according to claim 8, wherein, when substantially simultaneously writing different pieces of data into the first and second memory cells, the first memory cell selects the first program power supply, and the second memory cell selects the second program power supply.

11. The circuit according to claim 8, wherein, when substantially simultaneously writing the same data into the first and second memory cells, the first and second memory cells select the first program power supply, and the dummy cell selects the third program power supply.

12. The circuit according to claim 8, wherein when writing data into the first memory cell and writing no data into the second memory cell, the first memory cell is electrically connected to the third program power supply through the dummy cell, and the second memory cell is electrically disconnected from the first program power supply and the second program power supply.

13. The circuit according claim 8, wherein data is written into the first resistance change type memory element in the first memory cell, and then data is written into the second resistance change type memory element in the first memory cell.

14. The circuit according to claim 8, further comprising:

each of third switches connected to first and second memory cell, each third switch including a third current path and a third control gate connected to the first node.

15. The circuit according to claim 14, wherein, in a situation that the first and second power supplies are electrically connected to the first node through the first and second switches in the on-state, the third switch is turned on when the resistance value of the first resistance change type memory element is a first resistance value and the resistance value of the second resistance change type memory element is a second resistance value larger than the first resistance value, and the third switch is turned off when the resistance value of the first resistance change type memory element is the second resistance value and the resistance value of the second resistance change type memory element is the first resistance value.

16. The circuit according to claim 8, wherein, when the first and second power supplies are electrically disconnected from the first node, a pulse voltage is applied to at least one of the first and second control gates to charge the first node.

17. The circuit according to claim 14, wherein, when the first and second power supplies are electrically disconnected from the first node, a pulse voltage is applied to the third switch, and the first node is charged based on capacitive coupling of the third switch and the first node.

18. The circuit according to claim 8, wherein the resistance values of the first and second resistance change type memory elements change in accordance with a voltage flowing from a terminal having a first polarity toward a terminal having a second polarity or a voltage flowing from the terminal having the second polarity toward the terminal having the first polarity, and the second terminal and the third terminal connected to the first node are terminals having polarities different from each other.

19. The circuit according to claim 8, wherein the dummy cell comprises fourth, fifth, sixth, and seventh switches, one end of the fourth switch is connected to the first control line, the other end of the fourth switch is connected to one end of the fifth switch, the other end of the fifth switch is connected to the second control line, one end of the sixth switch is connected to the third program power supply, the other end of the sixth switch is connected to the other end of the fourth switch, one end of the seventh switch is connected to the other end of the fourth switch, and the other end of the seventh switch is connected to a fourth program power supply.

* * * * *